United States Patent
Zhao et al.

(10) Patent No.: US 12,041,814 B2
(45) Date of Patent: Jul. 16, 2024

(54) DISPLAY SUBSTRATE AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Erjin Zhao, Beijing (CN); Zhiliang Jiang, Beijing (CN); Lingran Wang, Beijing (CN); Jun Yan, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 50 days.

(21) Appl. No.: 17/800,559

(22) PCT Filed: Oct. 25, 2021

(86) PCT No.: PCT/CN2021/126056
§ 371 (c)(1),
(2) Date: Aug. 18, 2022

(87) PCT Pub. No.: WO2022/142633
PCT Pub. Date: Jul. 7, 2022

(65) Prior Publication Data
US 2023/0101823 A1    Mar. 30, 2023

(30) Foreign Application Priority Data
Jan. 4, 2021  (CN) ......................... 202110002159.7

(51) Int. Cl.
*H10K 50/844*   (2023.01)
*G06F 3/041*    (2006.01)
(Continued)

(52) U.S. Cl.
CPC ......... *H10K 50/844* (2023.02); *G06F 3/0412* (2013.01); *G06F 3/04164* (2019.05);
(Continued)

(58) Field of Classification Search
CPC .... H10K 50/844; H10K 59/40; G06F 3/0446; G06F 3/04164; G06F 3/0443;
(Continued)

(56) References Cited

U.S. PATENT DOCUMENTS

2016/0140896 A1   5/2016  Kwon et al.
2018/0033831 A1*  2/2018  An .................. G06F 3/0446
(Continued)

FOREIGN PATENT DOCUMENTS

CN    206039474 U    3/2017
CN    110888565 A    3/2020
(Continued)

OTHER PUBLICATIONS

Extended European Search Report in EP21913378.2, amiled Jul. 20, 2023, 14 pages.

*Primary Examiner* — Mark Edwards
(74) *Attorney, Agent, or Firm* — Arent Fox Schiff LLP; Michael Fainberg

(57) ABSTRACT

Disclosed are a display substrate and a display device. The display substrate includes a base substrate which includes a display region and a frame region surrounding the display region; at least one circle of blocking dam arranged around the display region in the frame region; and a touch metal layer located on the side, away from the base substrate, of the layer where the blocking dam is located; the touch metal layer includes a plurality of touch electrodes and a plurality of touch signal lines electrically connected to the plurality of touch electrodes, wherein the plurality of touch electrodes are at least partially located in the display region, and the (Continued)

plurality of touch signal lines are located in the frame region; the plurality of touch signal lines include: a plurality of first wirings and a plurality of second wirings arranged in parallel in a first direction.

16 Claims, 13 Drawing Sheets

(51) Int. Cl.
    *G06F 3/044*     (2006.01)
    *H10K 59/40*     (2023.01)

(52) U.S. Cl.
    CPC .......... *G06F 3/0443* (2019.05); *G06F 3/0446* (2019.05); *G06F 2203/04107* (2013.01); *G06F 2203/04111* (2013.01); *G06F 2203/04112* (2013.01); *H10K 59/40* (2023.02)

(58) Field of Classification Search
    CPC ......... G06F 3/0412; G06F 2203/04107; G06F 2203/04111; G06F 2203/04112
    USPC ........................................................ 345/174
    See application file for complete search history.

(56) References Cited

U.S. PATENT DOCUMENTS

| | | | |
|---|---|---|---|
| 2018/0053792 A1 | 2/2018 | Shin et al. | |
| 2020/0089350 A1* | 3/2020 | Han | G06F 3/0446 |
| 2020/0273919 A1 | 8/2020 | Ding et al. | |
| 2020/0401274 A1* | 12/2020 | Moon | G06F 3/04164 |
| 2021/0191550 A1 | 6/2021 | Wang et al. | |
| 2021/0200407 A1* | 7/2021 | Jang | G06F 3/04164 |
| 2021/0382572 A1* | 12/2021 | Lee | H10K 59/40 |
| 2022/0013607 A1* | 1/2022 | Lee | H10K 59/38 |
| 2022/0093693 A1* | 3/2022 | Kim | H10K 59/1213 |

FOREIGN PATENT DOCUMENTS

| | | | | |
|---|---|---|---|---|
| CN | 210379052 U | | 4/2020 | |
| CN | 112612371 A | * | 4/2021 | ......... G06F 3/04164 |
| EP | 3276457 A1 | | 1/2018 | |
| EP | 3651001 A1 | | 5/2020 | |
| KR | 2020135910 A | * | 12/2020 | ........... G06F 3/0412 |

* cited by examiner

DISPLAY SUBSTRATE AND DISPLAY DEVICE

CROSS REFERENCE TO RELATED APPLICATIONS

The present application is a US National Stage of International Application No. PCT/CN2021/126056, filed on Oct. 25, 2021, which claims priority to the Chinese Patent Application No. 202110002159.7, filed to the China Patent Office on Jan. 4, 2021 and entitled "DISPLAY SUBSTRATE AND DISPLAY DEVICE", the entire contents of which are incorporated herein by reference.

FIELD

The present disclosure relates to the technical field of display, in particular to a display substrate and a display device.

BACKGROUND

An organic light emitting diode (OLED) display device is a display screen based on an organic light emitting diode. The OLED display device has excellent features of being self-luminous, high in contrast ratio, thin, wide in viewing angle, high in response speed, applicable to a flexural panel, wide in using temperature range, simple in structure and manufacturing process and the like, thereby being of more and more interests and broad in application prospect. In the related art, a touch function is integrated in a mode of embedding a touch structure in an OLED display module, so as to realize integration of a display function and the touch function of the OLED display device.

SUMMARY

In an aspect, an embodiment of the present disclosure provides a display substrate, including: a base substrate, including: a display region, and a frame region surrounding the display region; at least one circle of blocking dam, arranged around the display region in the frame region; and a touch metal layer, located on a side, facing away from the base substrate, of a layer where the blocking dam is located, and including a plurality of touch electrodes, and a plurality of touch signal lines electrically connected to the plurality of touch electrodes, wherein the plurality of touch electrodes are at least partially located in the display region, and the plurality of touch signal lines are located in the frame region; the plurality of touch signal lines include: a plurality of first routing wires and a plurality of second routing wires arranged in parallel in a first direction, wherein orthographic projections of the plurality of first routing wires on the base substrate are located between an orthographic projection of the blocking dam on the base substrate and the display region, and orthographic projections of the plurality of second routing wires on the base substrate are located on a side, away from the display region, of the orthographic projection of the blocking dam on the base substrate.

Optionally, the above display substrate provided by the embodiment of the present disclosure further includes: an organic insulation layer having a first groove, wherein the first groove is located between the orthographic projection of the blocking dam on the base substrate and the orthographic projections of the plurality of first routing wires on the base substrate; and the quantity $N_1$ of the plurality of first routing wires meets a formula: $N_1 \leq (D-d_1-d_2)/(d_3+d_4)$, and the quantity $N_2$ of the plurality of second routing wires meets a formula: $N_2 \geq N-N_1$, where D is a shortest distance between a boundary of the display region and the blocking dam, $d_1$ is a shortest distance between the first groove and the first routing wires, $d_2$ is a width of the first groove in a second direction, $d_3$ is a wire width of the first routing wires $L_1$, $d_4$ is a spacing between the adjacent first routing wires, and N is the total quantity of the plurality of touch signal lines.

Optionally, in the above display substrate provided by the embodiment of the present disclosure, the quantity of the plurality of first routing wires is smaller than or equal to 27, and the quantity of the plurality of second routing wires is smaller than or equal to 23.

Optionally, in the above display substrate provided by the embodiment of the present disclosure, the plurality of touch signal lines further include: a plurality of third routing wires and a plurality of fourth routing wires arranged in parallel in a second direction, wherein the second direction intersects with the first direction; the third routing wires and the first routing wires are of an integrated structure in a one-to-one correspondence mode, and the fourth routing wires and the second routing wires are of an integrated structure in a one-to-one correspondence mode; and orthographic projections of the plurality of third routing wires and the plurality of fourth routing wires on the base substrate stride over the orthographic projection of the blocking dam on the base substrate.

Optionally, in the above display substrate provided by the embodiment of the present disclosure, the frame region includes a bending region located on a side of the blocking dam away from the display region; the orthographic projections of the second routing wires on the base substrate are located between the orthographic projection of the blocking dam on the base substrate and the bending region; the orthographic projections of the third routing wires on the base substrate are located between the orthographic projections of the corresponding first routing wires on the base substrate and the bending region; and the orthographic projections of the fourth routing wires on the base substrate are located between the orthographic projections of the corresponding second routing wires on the base substrate and the orthographic projections of the first routing wires on the base substrate.

Optionally, in the above display substrate provided by the embodiment of the present disclosure, the frame region further includes a pad region located on a side of the bending region away from the blocking dam; the plurality of touch signal lines further include: a plurality of fifth routing wires and a plurality of sixth routing wires arranged in parallel in the second direction, wherein the plurality of fifth routing wires and the plurality of sixth routing wires are arranged side by side on a side of the second routing wires adjacent to a central axis of the base substrate in the second direction; the fifth routing wires, the third routing wires and the first routing wires are of an integrated structure in a one-to-one correspondence mode, the fifth routing wires are connected to one ends of the first routing wires adjacent to the central axis of the base substrate in the second direction through the third routing wires, and the fifth routing wires extend to the pad region via the bending region; and the sixth routing wires, the fourth routing wires and the second routing wires are of an integrated structure in a one-to-one correspondence mode, the fourth routing wires are connected to the other ends of the second routing wires away from the central axis of the base substrate in the second direction, the sixth routing wires are connected to one ends of the second routing wires adjacent to the central axis of the base substrate in the second direction, and the sixth routing wires extend to the pad region via the bending region.

Optionally, in the above display substrate provided by the embodiment of the present disclosure, one ends of the first routing wires away from the central axis of the base substrate in the second direction and one ends of the fourth routing wires away from the second routing wires are located in a frame region adjacent to a frame region where the plurality of third routing wires are located; and orthographic projections, on the base substrate, of the ends of the first routing wires away from the central axis of the base substrate in the second direction and orthographic projections of the ends of the fourth routing wires away from the second routing wires on the base substrate are located between the orthographic projection of the blocking dam on the base substrate and the display region.

Optionally, in the above display substrate provided by the embodiment of the present disclosure, the plurality of touch signal lines further include: a plurality of seventh routing wires and a plurality of eighth routing wires arranged in parallel in the second direction, wherein the seventh routing wires and the first routing wires are of an integrated structure in a one-to-one correspondence mode, and the seventh routing wires are connected to the ends of the first routing wires away from the central axis of the base substrate in the second direction; and the eighth routing wires and the fourth routing wires are of an integrated structure in a one-to-one correspondence mode, and the eighth routing wires are connected to the ends of the fourth routing wires away from the second routing wires.

Optionally, in the above display substrate provided by the embodiment of the present disclosure, the plurality of touch signal lines are divided into two groups, and the two groups of touch signal lines are arranged symmetrically about a central axis of the base substrate in a second direction.

Optionally, in the above display substrate provided by the embodiment of the present disclosure, a wire width of the first routing wires and a wire width of the second routing wires are smaller than a wire width of the third routing wire, a wire width of the fourth routing wires, a wire width of the fifth routing wires and a wire width of the sixth routing wires, and the wire width of the first routing wires and the wire width of the second routing wires are approximately equal to a wire width of the seventh routing wires and a wire width of the eighth routing wires.

Optionally, in the above display substrate provided by the embodiment of the present disclosure, the wire width of the first routing wires and the wire width of the second routing wires range from 3 μm to 20 μm, the wire width of the third routing wires, the wire width of the fourth routing wires, the wire width of the fifth routing wires and the wire width of the sixth routing wires range from 5 μm to 20 μm, and the wire width of the seventh routing wires and the wire width of the eighth routing wires range from 3 μm to 20 μm.

Optionally, in the above display substrate provided by the embodiment of the present disclosure, resistance values of the touch signal lines are the same approximately.

Optionally, in the above display substrate provided by the embodiment of the present disclosure, the organic insulation layer further includes a second groove, and the second groove is located on a side of the blocking dam away from the display region; and the orthographic projections of the second routing wires on the base substrate are located in the second groove.

Optionally, in the above display substrate provided by the embodiment of the present disclosure, a shortest distance between the orthographic projections of the first routing wires on the base substrate and the orthographic projection of the blocking dam on the base substrate is greater than a shortest distance between the orthographic projections of the second routing wires on the base substrate and the orthographic projection of the blocking dam on the base substrate.

Optionally, in the above display substrate provided by the embodiment of the present disclosure, the shortest distance between the orthographic projections of the first routing wires on the base substrate and the orthographic projection of the blocking dam on the base substrate ranges from 30 μm to 200 μm, and the shortest distance between the orthographic projections of the second routing wires on the base substrate and the orthographic projection of the blocking dam on the base substrate ranges from 10 μm to 100 μm.

Optionally, in the above display substrate provided by the embodiment of the present disclosure, in the second direction, the width of the first groove is smaller than a width of the second groove.

Optionally, the above display substrate provided by the embodiment of the present disclosure further includes: at least one shielded wire, wherein the at least one shielded wire is located on at least one side of the plurality of first routing wires in a second direction, and/or located on at least one side of the plurality of second routing wires in the second direction.

Optionally, in the above display substrate provided by the embodiment of the present disclosure, the at least one shielded wire is arranged surrounding the touch signal lines containing the first routing wires, and/or the at least one shielded wire is arranged surrounding the touch signal lines containing the second routing wires.

Optionally, the above display substrate provided by the embodiment of the present disclosure further includes: a crack detection line located on a side of the shielded wire away from the display region; and the crack detection line strides over the blocking dam in a frame region where the first routing wires are located, and is located between the blocking dam and the display region in the other frame regions.

Optionally, the above display substrate provided by the embodiment of the present disclosure further includes: a ground line located between the shielded wire and the crack detection line, and a routing direction of the ground line is the same as a routing direction of the shielded wire approximately.

Optionally, in the above display substrate provided by the embodiment of the present disclosure, in a direction away from one side of the base substrate, a distance between the first routing wires and the base substrate is greater than a distance between the second routing wires and the base substrate.

In another aspect, an embodiment of the present disclosure further provides a display device, including the above display substrate.

DETAILED DESCRIPTION OF THE EMBODIMENTS

Figure 1:
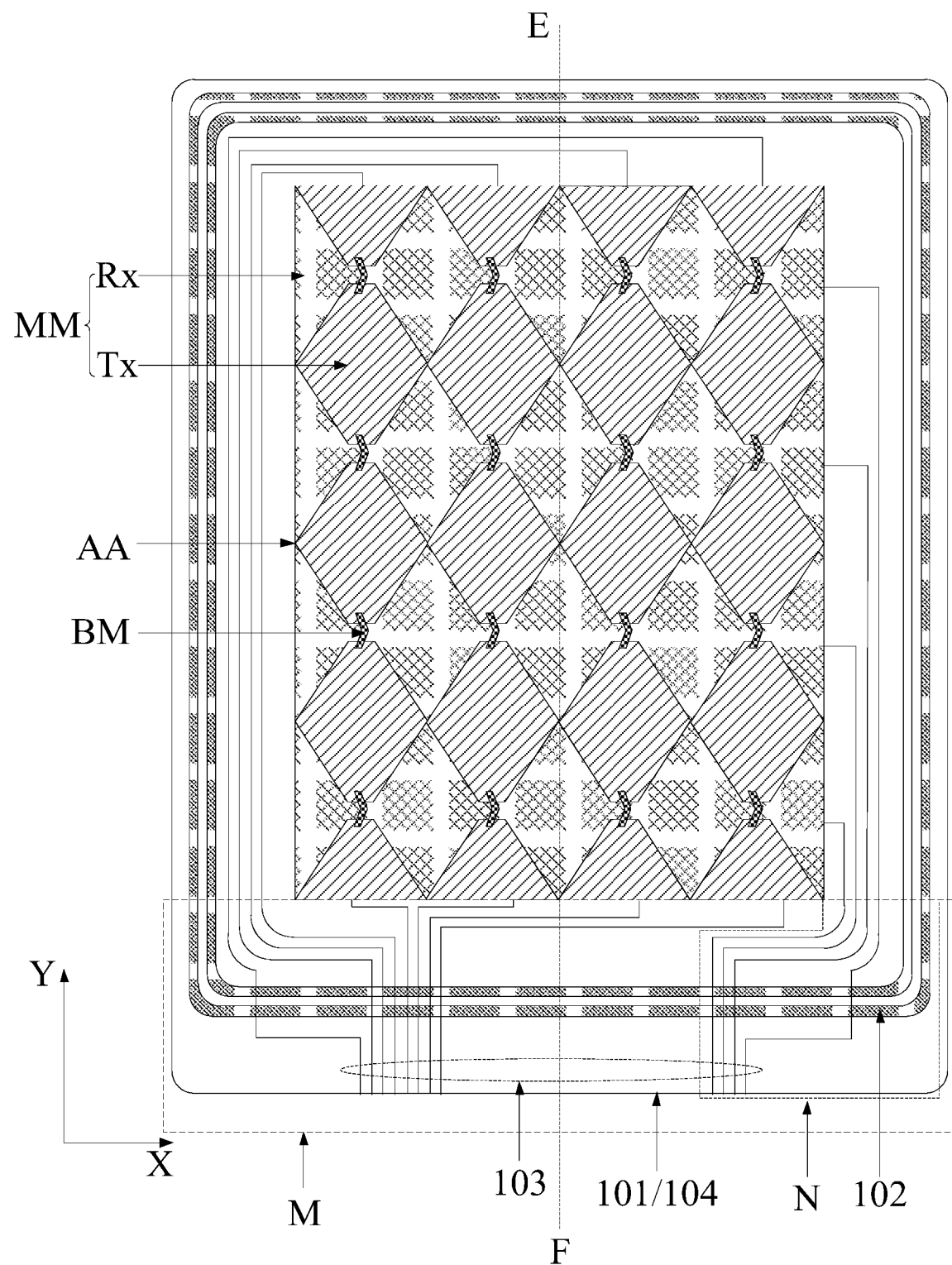
FIG. 1 is a schematic planar structural diagram of a display substrate provided by an embodiment of the present disclosure.

In order to make objectives, technical solutions and advantages of embodiments of the present disclosure clearer, the technical solutions of the embodiments of the present disclosure will be described clearly and completely below with reference to the accompanying drawings of the embodiments of the present disclosure. It needs to be noted that a size and a shape of each figure in the accompanying drawings do not reflect a true scale and are only intended to illustrate contents of the present disclosure. The same or similar reference numbers represent the same or similar elements or elements with the same or similar functions all the time. Apparently, the describe embodiments are a part but not all of embodiments of the present disclosure. Based on the described embodiments of the present disclosure, all other embodiments obtained by those ordinarily skilled in the art without creative work fall within the protection scope of the present disclosure.

Unless otherwise defined, technical or scientific terms used herein should have common meanings as understood by those ordinarily skilled in the art to which the present disclosure belongs. "First", "second" and similar words used in the specification and claims of the present disclosure do not represent any sequence, quantity or significance but are only used for distinguishing different components. "Include" or "contain" and similar words mean that an element or an item preceding the word covers elements or items listed after the word and their equivalents without excluding other elements or items. "Inner", "outer", "upper", "lower" and the like are only used for representing a relative position relation, and when an absolute position of a described object changes, the relative position relation may also change correspondingly.

In the market at present, requirements for a thinner display screen (such as a mobile phone) are higher and higher, so a flexible multi-layer on cell (FMLOC) technology emerges. An FMLOC process is to realize a touch function by making a metal mesh electrode layer on an encapsulation layer of a display module, so a touch structure, namely a touch screen panel (TSP) does not need to be added, and a screen thickness can be reduced.

The FMLOC process usually adopts two layers of metal, one of which is a metal mesh (MM) layer, and the other one of which is a bridge metal (BM) layer. A metal mesh is located in a display region and can be divided into a touch driving (Tx) metal mesh and a touch sensing (Rx) metal mesh in a transverse-longitudinal direction, one of the Rx metal mesh and the Tx metal mesh is connected mutually, and the other one of the Rx metal mesh and the Tx metal mesh is connected through the bridge metal layer. Besides, a blocking dam in the frame region and a plurality of touch signal lines (trace) are further arranged in an FMLOC product. The blocking dam surrounds the display region so as to block external water vapor or oxygen from entering the display region. The plurality of touch signal lines are arranged between the blocking dam and the display region and are electrically connected to the Tx metal mesh and the Rx metal mesh correspondingly respectively. However, with development of the market, a stricter requirement is brought up for a product bezel, especially a lower bezel, the above design of arranging all routing wires between the blocking dam and the display region greatly limits narrowing of the bezel.

Figure 2:
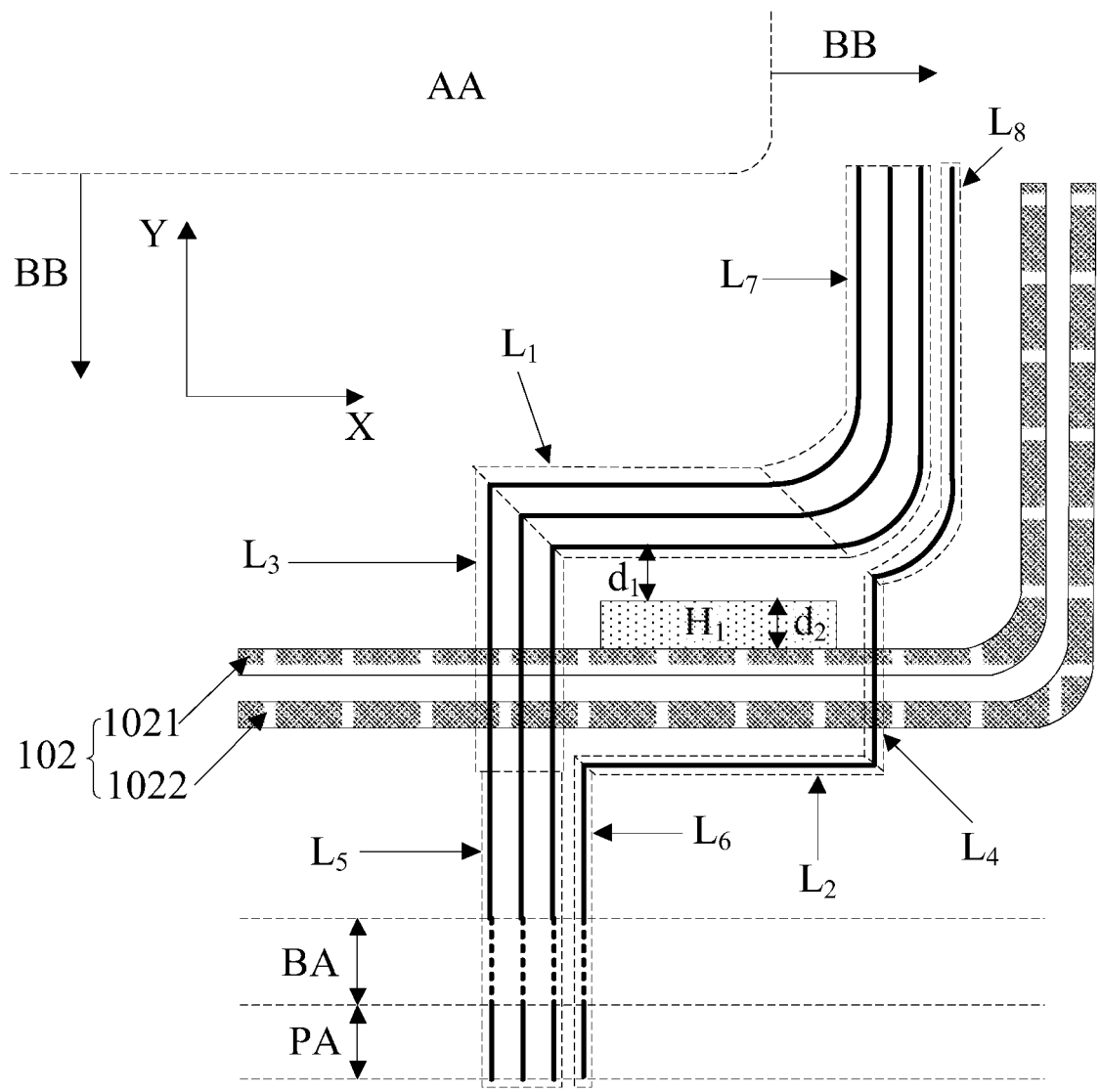
FIG. 2 is a schematic structural enlarged view of a region N in FIG. 1.

Aiming to the above problem in the related art, an embodiment of the present disclosure provides a display substrate, as shown in FIG. 1 and FIG. 2, including: a base substrate 101, at least one circle of blocking dam 102 and a touch metal layer MM.

The base substrate 101 includes: a display region AA, and a frame region BB surrounding the display region AA.

The at least one circle of blocking dam 102 is arranged around the display region AA in the frame region BB.

The touch metal layer MM is located on a side, facing away from the base substrate 101, of a layer where the blocking dam 102 is located. The touch metal layer MM includes a plurality of touch electrodes Tx/Rx and a plurality of touch signal lines 103 electrically connected to the plurality of touch electrodes Tx/Rx. The plurality of touch electrodes Tx/Rx are at least partially located in the display region AA, and the plurality of touch signal lines 103 are located in the frame region BB. The plurality of touch signal lines 103 may include: a plurality of first routing wires $L_1$ and a plurality of second routing wires $L_2$ arranged in parallel in a first direction X. Orthographic projections of the plurality of first routing wires $L_1$ on the base substrate 101 are located between an orthographic projection of the blocking dam 102 on the base substrate 101 and the display region AA. Orthographic projections of the plurality of second routing wires $L_2$ on the base substrate 101 are located on a side, away from the display region AA, of the orthographic projection of the blocking dam 102 on the base substrate 101.

In the above display substrate provided by the embodiment of the present disclosure, the plurality of first routing wires $L_1$ are arranged in a frame region BB on an inner side of the blocking dam 102, and the plurality of second routing wires $L_2$ parallel to the first routing wires $L_1$ are arranged in a frame region BB on an outer side of the blocking dam 102, so that a space on the outer side of the blocking dam 102 can be used reasonably, a width of the frame region BB within the blocking dam 102 can be reduced effectively, and a product demand of a narrower bezel design is realized.

It needs to be noted that FIG. 1 makes a description by taking the plurality of first routing wires $L_1$ and the plurality of second routing wires $L_2$ (arranged in parallel and contained in a frame region BB on a lower side) being arranged on the inner side and the outer side of the blocking dam 102 respectively as an example. During specific implementation, in a frame region BB on a left side, a frame region BB on a right side and/or a frame region BB on an upper side, in order to reduce a wiring space between the blocking dam 102 and the display region AA, the touch signal lines 103 may be considered to be divided into two parts and then are arranged on the inner side and the outer side of the blocking dam 102 respectively.

Optionally, the above display substrate provided by the embodiment of the present disclosure, as shown in FIG. 1 and FIG. 2, may further include an organic insulation layer 104 having a first groove $H_1$, the first groove $H_1$ is configured to prevent water and oxygen from invading the display region AA, may be specifically located between the orthographic projection of the blocking dam 102 on the base substrate 101 and the orthographic projections of the first routing wires $L_1$ on the base substrate 101 and makes contact with the blocking dam 102, and a shortest distance between the first groove and the first routing wires $L_1$ is $d_1$. In some embodiments, a slope may be set between the display region AA and the groove $H_1$ according to actual requirements, here, the shortest distance $d_1$ of the first groove $H_1$ is a shortest distance on a plane parallel to the base substrate, that is, the shortest distance $d_1$ of the first groove $H_1$ does not include the slope between the display region AA and the groove $H_1$. In other words, when it is the slope between the display region AA and the groove $H_1$, at least a part of the plurality of first routing wires may be arranged on the slope. In some embodiments, the quantity $N_1$ of the plurality of first routing wires $L_1$ meets a formula: $N_1 \leq (D-d_1-d_2)/(d_3+d_4)$, where D represents a shortest distance between a boundary (namely, a boundary line between the display region AA and the frame region BB where the first groove $H_1$ is located) of the display region AA and the blocking dam 102, $d_2$ represents a width of the first groove $H_1$ in a second direction Y, $d_3$ represents a wire width of the first routing wires $L_1$, and $d_4$ represents a spacing between the first routing wires $L_1$. The quantity $N_2$ of the plurality of second routing wires $L_2$ meets a formula: $N_2 \geq N-N_1$, where N is the total quantity of all the touch signal lines 103 electrically connected to the metal mesh Tx and the metal mesh Rx. Exemplarily, the quantity of the plurality of first routing wires $L_1$ is smaller than or equal to 27, and the quantity of the plurality of second routing wires $L_2$ is smaller than or equal to 23. Optionally, $N_1=(D-d_1-d_2)/(d_3+d_4)$ and $N_2=N-N_1$, in this case, the frame region BB of a display panel is the narrowest and does not interfere with normal displaying of the display region AA.

Optionally, in the above display substrate provided by the embodiment of the present disclosure, as shown in FIG. 2, the plurality of touch signal lines 103 may further include: a plurality of third routing wires $L_3$ and a plurality of fourth routing wires $L_4$ arranged in parallel in a second direction Y, wherein the second direction Y intersects with the first direction X; the third routing wires $L_3$ and the first routing wires $L_1$ are of an integrated structure in a one-to-one correspondence mode, and the fourth routing wires $L_4$ and the second routing wires $L_2$ are of an integrated structure in a one-to-one correspondence mode; and orthographic projections of the plurality of third routing wires $L_3$ and the plurality of fourth routing wires $L_4$ on the base substrate 101 stride over the orthographic projection of the blocking dam 102 on the base substrate 101.

By arranging the plurality of third routing wires $L_3$ and the plurality of fourth routing wires $L_4$ striding over the blocking dam 102, on the one hand, the first routing wires $L_1$ on the inner side of the blocking dam 102 may be led out to the outer side of the blocking dam 102, so that it is conducive to realizing connection between the touch signal lines 103 and an external driving circuit. In some embodiments, the external driving circuit may be electrical connection of a flexible print circuit board (FPC). On the other hand, the second routing wires $L_2$ on the outer side of the blocking dam 102 may be led out to the inner side of the blocking dam 102, it is conducive to realizing electrical connection between the touch signal lines 103 and the metal meshes Tx or Rx in the display region AA, moreover, an arrangement mode of the second routing wires $L_2$ may reasonably utilize a space on the outer side of the blocking dam 102, so that a width of a frame region BB on the inner side of the blocking dam 102 may be reduced, and a design of a narrower frame region BB is realized.

Optionally, in the above display substrate provided by the embodiment of the present disclosure, in order to realize a technical effect of a narrow bezel, as shown in FIG. 2, a bending region BA may be further arranged on a side of the blocking dam 102 away from the display region AA. In this case, the orthographic projections of the second routing wires $L_2$ on the base substrate 101 may be located between the orthographic projection of the blocking dam 102 on the base substrate 101 and the bending region BA, the orthographic projections of the third routing wires $L_3$ on the base substrate 101 may be located between the orthographic projections of the corresponding first routing wires $L_1$ on the base substrate 101 and the bending region BA; and the orthographic projections of the fourth routing wires $L_4$ on the base substrate 101 may be located between the orthographic projections of the corresponding second routing wires $L_2$ on the base substrate 101 and the orthographic projections of the first routing wires $L_1$ on the base substrate 101, in other words, the third routing wires $L_3$ extend from the first routing wires $L_1$ in an integrated design to the bending region BA, and the fourth routing wires $L_4$ extend from the second routing wires $L_2$ in an integrated design to the inner side of the blocking dam 102.

Optionally, in the above display substrate provided by the embodiment of the present disclosure, as shown in FIG. 2, the frame region BB may further include a pad region PA located on a side of the bending region BA away from the blocking dam 102, and the plurality of touch signal lines 103 may further include: a plurality of fifth routing wires $L_5$ and a plurality of sixth routing wires $L_6$ arranged in parallel in the second direction Y. The plurality of fifth routing wires $L_5$ and the plurality of sixth routing wires $L_6$ are arranged side by side on a side of the second routing wires $L_2$ adjacent to a central axis of the base substrate 101 in the second direction Y; the fifth routing wires $L_5$, the third routing wires $L_3$ and the first routing wires $L_1$ are of an integrated structure in a one-to-one correspondence mode, the fifth routing wires $L_5$ are connected to one ends of the first routing wires $L_1$ adjacent to the central axis of the base substrate 101 in the second direction Y through the third routing wires $L_3$, and the fifth routing wires $L_5$ extend to the pad region PA via the bending region BA; and the sixth routing wires $L_6$, the fourth routing wires $L_4$ and the second routing wires $L_2$ are of an integrated structure in a one-to-one correspondence mode, the fourth routing wires $L_4$ are connected to the other ends of the second routing wires $L_2$ away from the central axis of the base substrate 101 in the second direction Y, the sixth routing wires $L_6$ are connected to one ends of the second routing wires $L_2$ adjacent to the central axis of the base substrate in the second direction Y, and the sixth routing wires $L_6$ extend to the pad region PA via the bending region BA.

In other embodiments, the pad region PA has a plurality of contact pads (or called a bonding pad or pad), and each contact pad is configured to be electrically connected to one fifth routing wire $L_5$ or one sixth routing wire $L_6$. The contact pads may be exposed on a surface of the pad region PA, that is, not covered with any layer, so that electrical connection to the flexible print circuit board is convenient. The flexible print circuit board is electrically connected to an external controller and configured to transmit a signal or power from the external control to the fifth routing wires $L_5$ and the sixth routing wire $L_6$.

Figure 3:
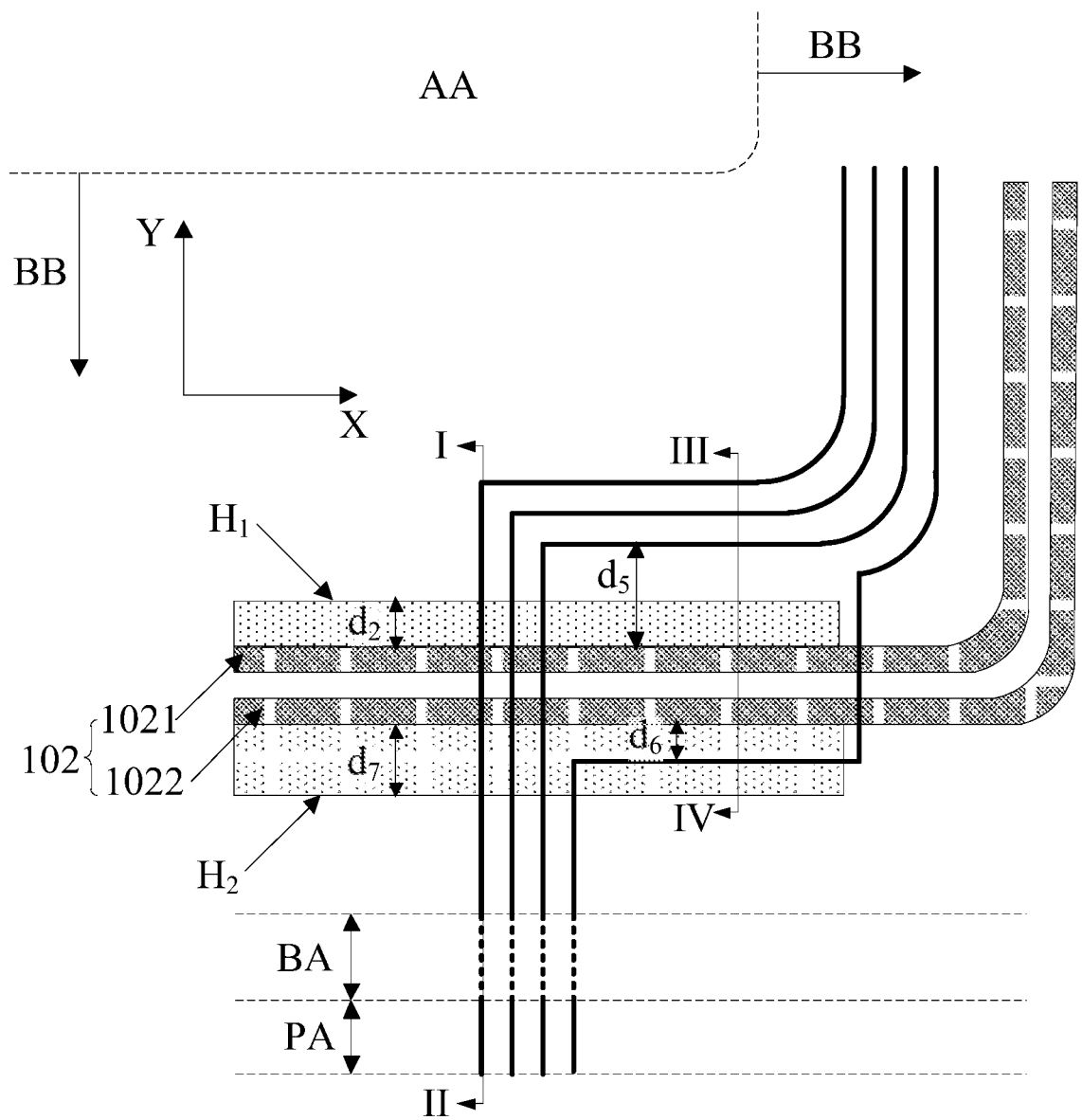
FIG. 3 is another schematic structural enlarged view of a region N in FIG. 1.

In some embodiments, a wiring mode of a common (Com) signal line, a power (VDD/VSS) line, a ground (GND) line and the like arranged in the frame region BB may also adopt the above wiring mode of the touch signal lines 103. In some embodiments, as shown in FIG. 3 to FIG. 5, the touch signal lines 103 may include: a first portion 103a arranged on the same layer as the metal mesh layer MM, and a second portion 103b arranged on the same layer as the bridge metal layer BM and electrically connected to the first portion 103a.

The touch signal lines 103 are arranged to double-layer routing wires including the first portion 103a and the second portion 103b, so that after one layer of routing wires is broken locally, a touch signal may be still loaded to the metal mesh layer MM through the other layer of routing layers, thus a problem of touch failure prone to being caused by breaking of a single layer of routing wires is effectively solved, and moreover, compared with a design of the single layer of routing wires, the double layer of routing layers may also reduce resistance values of the touch signal lines 103. During specific implementation, the first portion 103a and the second portion 103b are electrically connected through a via hole penetrating through an inorganic insulation layer 105.

Figure 4:
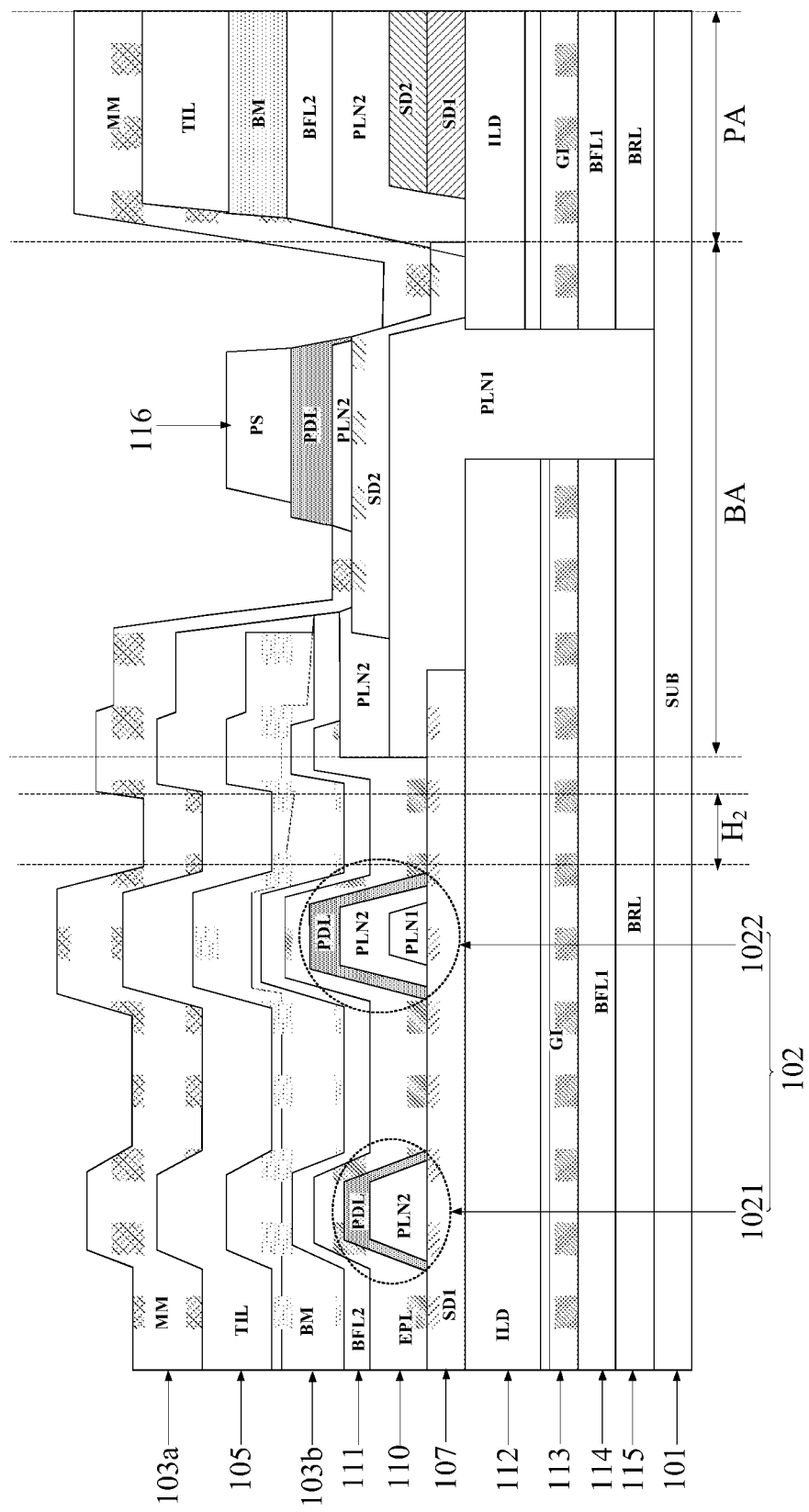
FIG. 4 is a schematic structural sectional view in a line I-II in FIG. 3.
Figure 5:
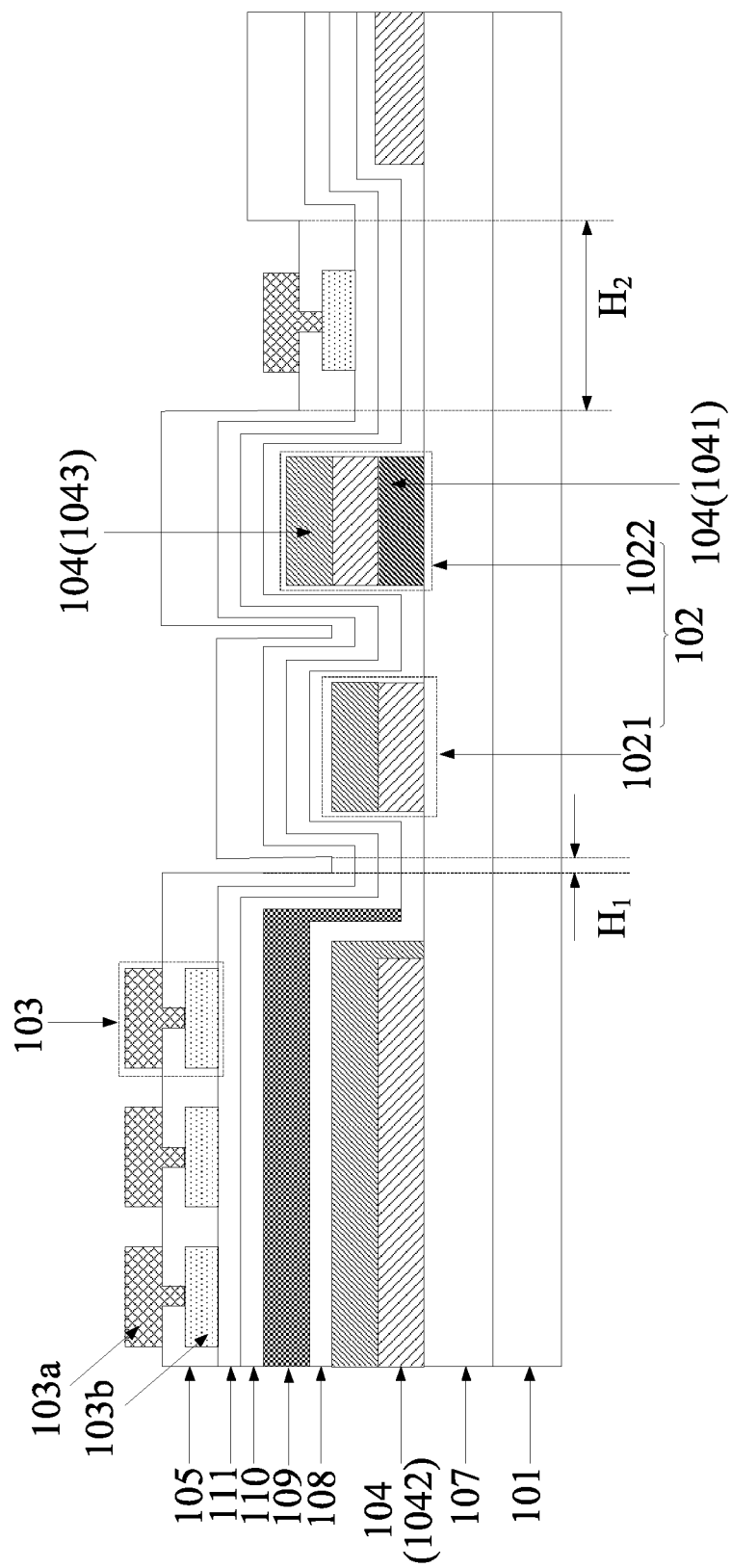
FIG. 5 is a schematic structural sectional view in a line III-IV in FIG. 3.

In some embodiments, as shown in FIG. 4, in order to make a bending stress of the bending region BA uniform, the fifth routing wires $L_5$ and the sixth routing wire $L_6$ contained in the touch signal lines 103 may be transferred from the metal mesh layer MM and the bridge metal layer BM to a second source-drain metal layer 106 (SD2) in the bending region BA for wiring, and then return to the metal mesh layer MM and the bridge metal layer BM in the pad region PA for wiring.

It needs to be noted that in the present disclosure, a touch function can be realized by using not only a mutual-capacitance mode of a metal mesh technology, but also a self-capacitance mode. When the self-capacitance mode is adopted, the display substrate may include a plurality of self-capacitance electrodes arranged on a different layer from a plurality of touch routing wires, the inorganic insulation layer 105 is located between a layer where the plurality of touch routing wires and a layer where the plurality of self-capacitance electrodes are located, and each touch routing wire is electrically connected to a self-capacitance electrode through a via hole penetrating through the inorganic insulation layer 105.

Besides, a display side of the display substrate may be usually a front side by default, and a side opposite to the display side is a back side. Bending of the bending region BA makes the pad region PA located on the side of the bending region BA away from the display region DA be located on the back side of the display substrate, so that a space utilization ration can be increased, and an area occupied by the frame region BB can be reduced.

Optionally, in the above display substrate provided by the embodiment of the present disclosure, as shown in FIG. 2, one ends of the first routing wires $L_1$ away from the central axis of the base substrate 101 in the second direction Y and one ends of the fourth routing wires $L_4$ away from the second routing wires $L_2$ are located in a frame region adjacent to a frame region where the plurality of third routing wires $L_3$ are located; and orthographic projections, on the base substrate 101, of the ends of the first routing wires $L_1$ away from the central axis of the base substrate 101 in the second direction Y and orthographic projections of the ends of the fourth routing wires $L_4$ away from the second routing wires $L_2$ on the base substrate 101 are located between the orthographic projection of the blocking dam 102 on the base substrate 101 and the display region AA.

It can be seen from the above description that in the present disclosure, the touch signal lines 103 including the first routing wires $L_1$, the third routing wires $L_3$ and the fifth routing wires $L_5$ are bent from a frame region BB on a right side to a frame region BB on a lower side, then stride over the blocking dam 102 and then extend to the pad region PA via the bending region BA to be electrically connected to the flexible print circuit board; and the touch signal lines 103 including the second routing wires $L_2$, the fourth routing wire $L_4$ and the sixth routing wire $L_6$ stride over the blocking dam 102 from the frame region BB on the right side, then are bent to the frame region BB on the lower side, and then extend to the pad region PA via the bending region BA to be electrically connected to the flexible print circuit board. In this way, on the one hand, it is guaranteed that all the touch signal lines 103 do not overlap, and thus unfavorable shorting is avoided; and on the other hand, it is guaranteed that winding of all the touch signal lines 103 is short, and thus signal delay (RC delay) is avoided. Besides, an arrangement mode of the second routing wires $L_2$ can reasonably utilize the space on the outer side of the blocking dam 102, so that the width of the frame region BB on the inner side of the blocking dam 102 can be reduced, and the design of the narrower frame region BB is realized.

Optionally, in the above display substrate provided by the embodiment of the present disclosure, as shown in FIG. 2, the plurality of touch signal lines 103 may further include: a plurality of seventh routing wires $L_7$ and a plurality of eighth routing wires $L_8$ arranged in parallel in the second direction Y. The seventh routing wires $L_7$ and the first routing wires $L_1$ are of an integrated structure in a one-to-one correspondence mode, and the seventh routing wires $L_7$ are connected to the ends of the first routing wires $L_1$ away from the central axis of the base substrate 101 in the second direction Y; and the eighth routing wires $L_8$ and the fourth routing wires $L_4$ are of an integrated structure in a one-to-one correspondence mode, and the eighth routing wires $L_8$ are connected to the ends of the fourth routing wires $L_4$ away from the second routing wires $L_2$.

The ends of the first routing wires $L_1$ away from the central axis of the base substrate 101 in the second direction Y are located in the frame region adjacent to the frame region where the plurality of third routing wires $L_3$, so the seventh routing wires $L_7$ may extend in the adjacent frame region in the second direction Y. Besides, the ends of the fourth routing wires $L_4$ away from the second routing wires $L_2$ are located in the frame region adjacent to the frame region where the third routing wire $L_3$ are located, so the eighth routing wires $L_8$ may also extend in the adjacent frame region in the second direction Y. In this way, a wiring length of the touch signal lines 103 is reduced to the maximum degree, so that resistance values of the touch signal lines 103 are small, and signal delay of the touch signal lines 103 is avoided.

Optionally, in the above display substrate provided by the embodiment of the present disclosure, as shown in FIG. 1, the plurality of touch signal lines 103 may be divided into two groups, and the two groups of touch signal lines 103 are arranged symmetrically about the central axis EF of the base substrate 101 in the second direction Y. Specifically, wiring modes of the touch signal lines 103 on the inner side and the outer side of the blocking dam are the same on two sides of the central axis EF of the base substrate 101 in the second direction Y, but the specific quantities of the two groups of touch signal lines are not limited, that is, the quantities of the two groups of touch signal lines may be the same or not. In this way, balanced wiring is convenient, process stability is improved, and the design of the narrower frame region is realized.

Optionally, in the above display substrate provided by the embodiment of the present disclosure, in order to guarantee that the resistance values of all the touch signal lines 103 are the same approximately, a wire width of the first routing wires $L_1$ and a wire width of the second routing wires $L_2$ may be set to be smaller than a wire width of the third routing wires $L_3$, a wire width of the fourth routing wires $L_4$, a wire width of the fifth routing wires $L_5$ and a wire width of the sixth routing wires $L_6$, and the wire width of the first routing wires $L_1$ and the wire width of the second routing wires $L_2$ are approximately equal to a wire width of the seventh routing wires $L_7$ and the wire width of the eighth routing wires $L_8$.

It needs to be noted that during specific implementation, due to influence of a limit of process conditions or measurement and other factors, the above "approximately" may be "completely equal" or may have some deviation, so an "approximately" relation among the above features falls within the protection scope of the present disclosure as long as it meets allowing of an error (for example, fluctuation of more than or less than 10%).

Optionally, in the above display substrate provided by the embodiment of the present disclosure, the wire width of the first routing wires $L_1$ and the wire width of the second routing wires $L_2$ may be 3 µm to 20 µm, for example, 7.3 µm, the wire width of the third routing wires $L_3$, the wire width of the fourth routing wires $L_4$, the wire width of the fifth routing wires $L_5$ and the wire width of the sixth routing wires $L_6$ may be 5 µm to 20 µm, for example, 9.2 µm, and the wire width of the seventh routing wires $L_7$ and the wire width of the eighth routing wires $L_8$ may be 3 µm to 20 µm, for example, 7.2 µm.

Optionally, the above display substrate provided by the embodiment of the present disclosure, as shown in FIG. 3 and FIG. 5, may further include: an organic insulation layer 104. The first groove $H_1$ and a second groove $H_2$ are formed in the organic insulation layer 104. The first groove $H_1$ is located between the blocking dam 102 and the display region AA. The second groove $H_2$ is located on a side of the blocking dam 102 away from the display region AA. The orthographic projection of the first routing wires $L_1$ on the base substrate 101 are located between the first groove $H_1$ and the display region AA, and the orthographic projections of the second routing wires $L_2$ on the base substrate 101 are located in the second groove $H_2$.

In some embodiments, the first groove $H_1$ is configured to isolate the insulation layer 104 so as to prevent water and oxygen from invading the display region AA. The second groove $H_2$ is configured to release the bending stress. By arranging the first routing wires $L_1$ on the inner side of the blocking dam 102 between the first groove $H_1$ and the display region AA, the first routing wires $L_1$ on the inner side of the blocking dam 102 are prevented from overlapping with the first groove $H_1$, and thus the first groove $H_1$ can be prevented from affecting an existing wire routing mode. There is no organic encapsulation layer 109 (IR) at the second groove $H_2$, a structure of the organic insulation layer 104 below the touch signal lines 103 is simple, and it is basically a large-area cut-out design, so a segment difference of film layers is quite small, that is, flatness of the film layers is good, thus arranging the second routing wires $L_2$ on the outer side of the blocking dam 102 to be in the second groove $H_2$ greatly benefits implementation of a design and a process of the touch signal lines 103.

Optionally, in the above display substrate provided by the embodiment of the present disclosure, in a direction away from one side of the base substrate, a distance between the first routing wires $L_1$ and the base substrate 101 is greater than a distance between the second routing wires $L_2$ and the base substrate 101. Specifically, as shown in FIG. 5, there are more film layers below the first routing wires $L_1$ on the inner side of the blocking dam 102, which are the base substrate 101, a first source-drain metal layer 107 (SD1), a second flat layer 1042 (PLN2), a pixel defining layer 1043 (PDL), a first organic encapsulation layer 108, an organic encapsulation layer 109, a second inorganic encapsulation layer 110 and a second etching blocking layer 111 (BFL2) in sequence from bottom to top. There are fewer film layers below the second routing wires $L_2$ on the outer side of the blocking dam 102, which are the base substrate 101, the first source-drain metal layer 107, the first inorganic encapsulation layer 108, the second inorganic encapsulation layer 110 and the second etching blocking layer 111 in sequence from bottom to top. In some embodiments, it is guaranteed that the wire widths of the first routing wires $L_1$ and the second routing wires $L_2$ on the inner side and the outer side of the blocking dam 102 are the same approximately. Optionally, the first inorganic encapsulation layer 108, the organic encapsulation layer 109 and the second inorganic encapsulation layer 110 constitute a thin film encapsulation layer (EPL).

As shown in FIG. 4 and FIG. 5, in some embodiments, the organic insulation layer 104 may include a first flat layer 1041 (PLN1), a second flat layer 1042 and a pixel defining layer 1043. The blocking dam 102 may include a first blocking dam 1021 surrounding the display region AA and a second blocking dam 1022 surrounding the first blocking dam 1021. A laminated pattern of the first blocking dam 1021 is located on the second flat layer 1042 and the pixel defining later 1043, and a laminated pattern of the second blocking dam 1022 is located on the first flat layer 1041, the second flat layer 1042 and the pixel defining layer 1043. The first blocking dam 1021 has no a film layer pattern located on the first flat layer 1041 compared with the second blocking dam 1022, so a height of the first blocking dam 1021 relative to the base substrate 101 is smaller than a height of the second blocking dam 1022 relative to the base substrate 101, so that a path of external water vapor and oxygen entering the display region AA is longer, difficulty of entering the display region AA is increased, and a blocking capability of the blocking dam 102 is further improved. In some embodiments, a width of the first blocking dam 1021, a width of the second blocking dam 1022 and a spacing between the first blocking dam 1021 and the second blocking dam 1022 may be the same approximately, for example, 30 μm. A shape of a section of the first blocking dam 1021 and the second blocking dam 1022 may be a rectangle shown in FIG. 4, or may be a trapezoid shown in FIG. 5, at the moment, a side edge of at least one side, close to the display region AA, of each of the first blocking dam 1021 and the second blocking dam 1022 is a slope, which is not limited here.

In some embodiments, in order to increase adhesion force of the third routing wires $L_3$ and the fourth routing wire $L_4$ striding over the blocking dam 102, the widths of the third routing wires $L_3$ and the fourth routing wires $L_4$ at a gap of the first blocking dam 1021 and the second blocking dam 1022 may be set to be smaller.

It needs to be noted that in the present disclosure, "inner side of the blocking dam 102" specifically refers to a side of the first blocking dam 1021 close to the display region AA, and "outer side of the blocking dam 102" specifically refers to a side of the second blocking dam 1022 away from the display region AA.

Besides, as shown in FIG. 4, the display substrate may further include: an interlayer dielectric layer 112 (ILD), a gate insulation layer 113 (GI), a first etching blocking layer 114 (BFL1), a buffer layer 115 (BRL) and a pad layer 116 (PS). It should be understood that other necessary components of the display substrate should be understood by those ordinarily skilled in the art, which is neither repeated here nor serves as limit on the present disclosure.

Optionally, in the above display substrate provided by the embodiment of the present disclosure, as shown in FIG. 3, a shortest distance $d_5$ between the orthographic projections of the first routing wires $L_1$ on the base substrate 101 and the orthographic projection of the blocking dam 102 on the base substrate 101 is greater than a shortest distance $d_6$ between the orthographic projections of the second routing wires $L_2$ on the base substrate 101 and the orthographic projection of the blocking dam 102 on the base substrate 101. In this way, the first routing wires $L_1$ on the inner side of the blocking dam 102 can keep off the first groove $H_1$, so that the first routing wires $L_1$ on the inner side of the blocking dam 102 do not overlap with the first groove $H_1$.

Optionally, in the above display substrate provided by the embodiment of the present disclosure, the shortest distance $d_5$ between the orthographic projections of the first routing wires $L_1$ on the base substrate 101 and the orthographic projection of the blocking dam 102 on the base substrate 101 may be 30 μm to 200 μm, for example, 48.9 μm. The shortest distance $d_6$ between the orthographic projections of the second routing wires $L_2$ on the base substrate 101 and the orthographic projection of the blocking dam 102 on the base substrate 101 may be 10 μm to 100 μm, for example 29.4 μm.

Figure 6:
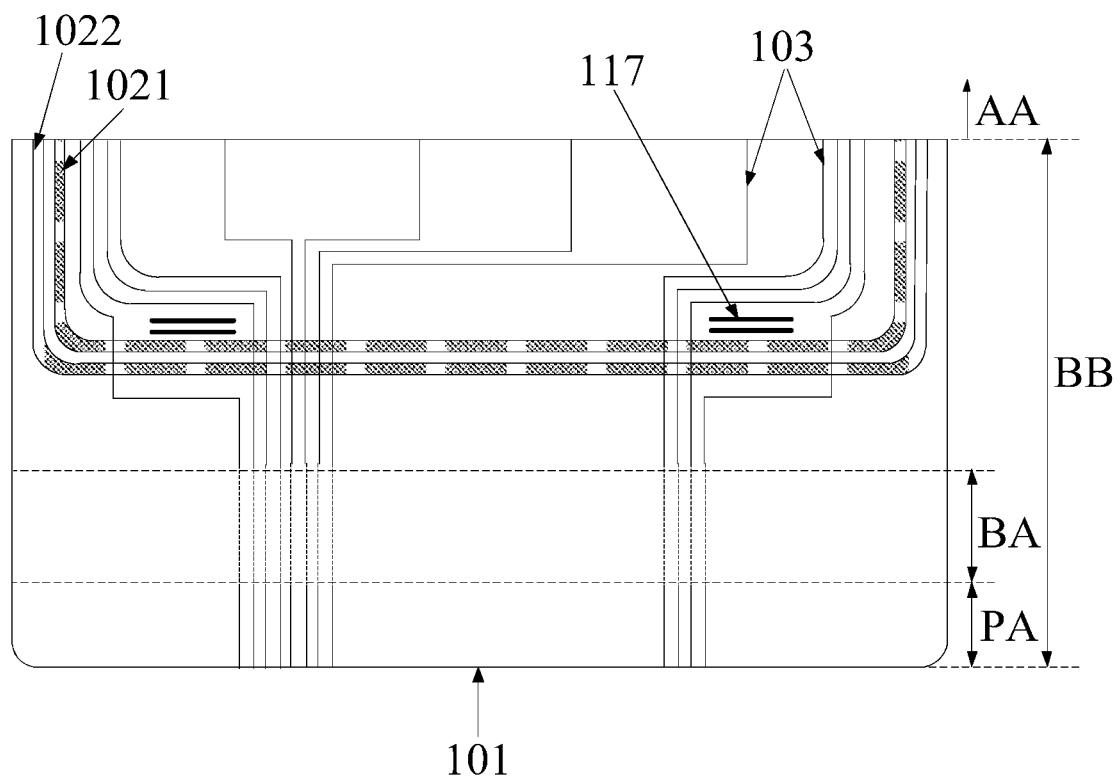
FIG. 6 is a schematic structural enlarged view of a region M in FIG. 1.

Optionally, in the above display substrate provided by the embodiment of the present disclosure, in order to realize a technical effect of the narrower bezel, as shown in FIG. 3, in the second direction Y, the width $d_2$ of the first groove $H_1$ in the second direction Y is smaller than a width $d_7$ of the second groove $H_2$ in the second direction Y. Exemplarily, the width $d_2$ of the first groove $H_1$ may be 30 μm to 50 μm, and the width $d_7$ of the second groove $H_2$ may be greater than or equal to 70 μm. In some embodiments, as shown in FIG. 6, a dummy line 117 extending in the first direction X may be arranged between the blocking dam 102 and the first routing wires $L_1$ on the inner side of the blocking dam 102, the dummy line 117 does not overlap with a boundary of the first groove $H_1$, that is, the dummy line 117 may be arranged between the first groove $H_1$ and the first routing wires $L_1$, or may be arranged in the first groove $H_1$.

Before arranging the dummy line 117, a region between the blocking dam 102 and the first routing wires $L_1$ on the inner side of the blocking dam 102 is an empty region, by arranging the dummy line 117 in the empty region, wiring of the empty region may be closer to a structure of a surrounding wiring region, so that process stability and product stability can be improved.

Optionally, the above display substrate provided by the embodiment of the present disclosure, as shown in FIG. 7 to FIG. 11, in order to shield interference, may further include: at least one shielded wire 118 (Guard). The above at least one shielded wire 118 may be located on at least one side of the plurality of first routing wires $L_1$ in the second direction Y, and/or located on at least one side of the plurality of second routing wires $L_2$ in the second direction Y.

Figure 7:
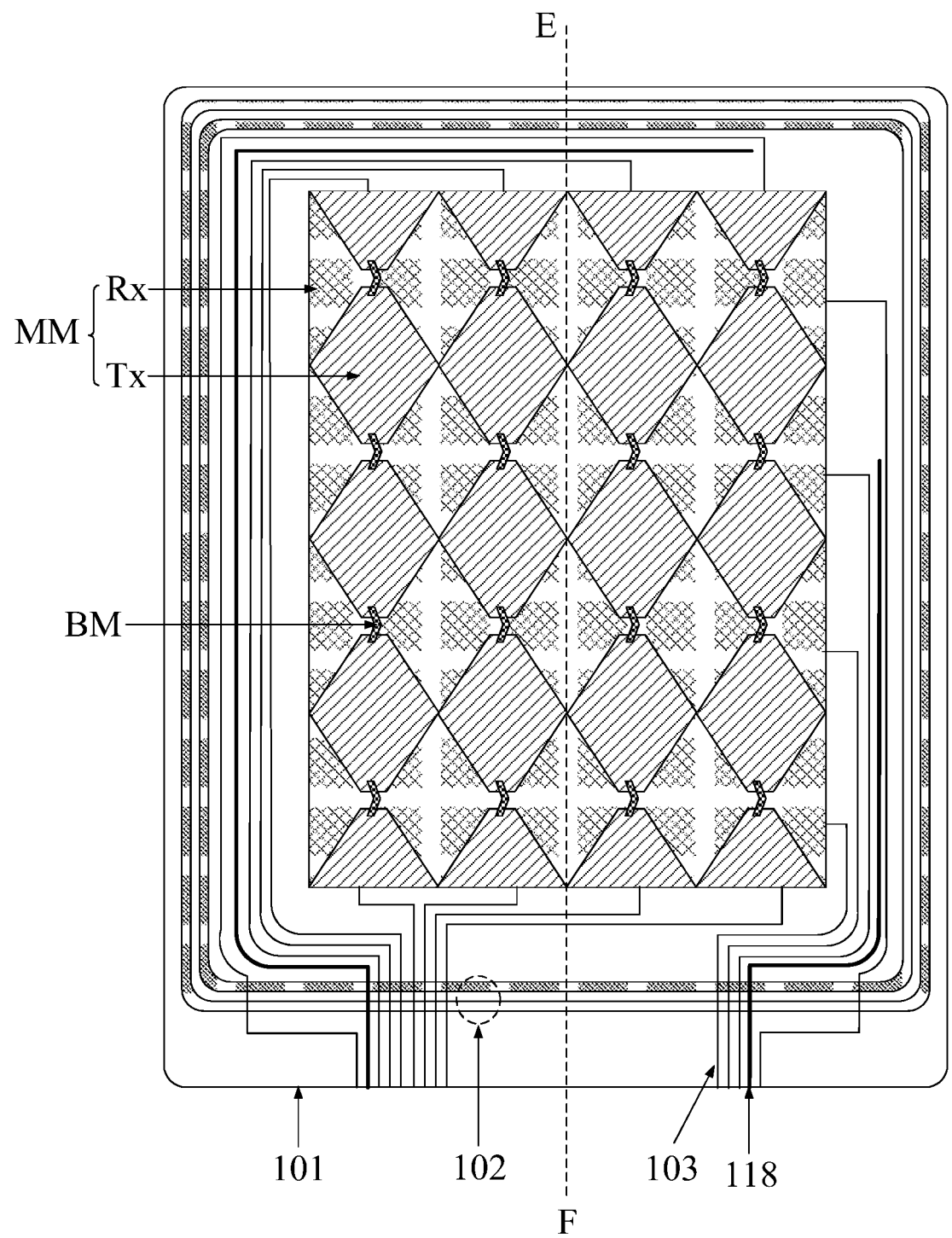
FIG. 7 is another schematic planar structural diagram of a display substrate provided by an embodiment of the present disclosure.
Figure 8:
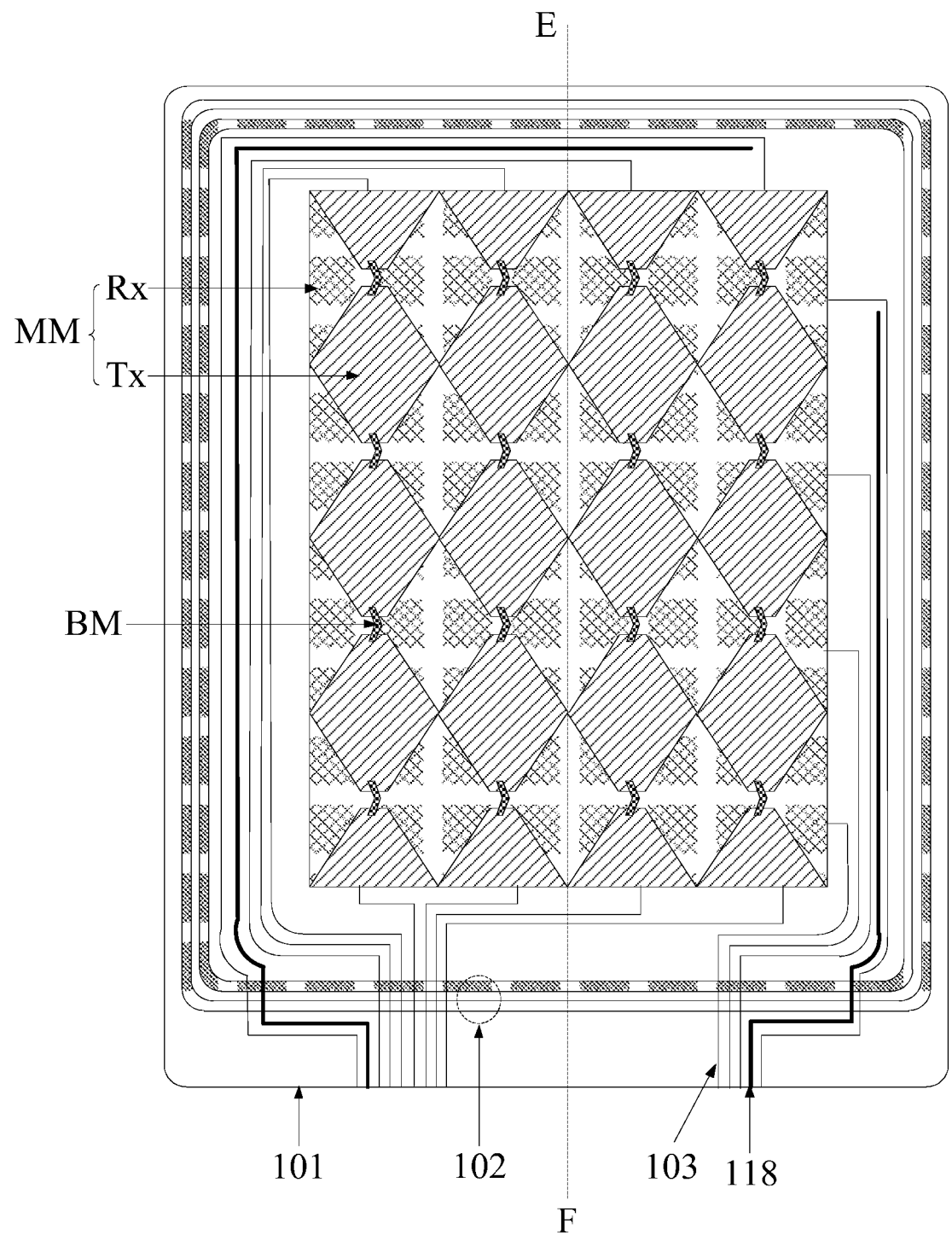
FIG. 8 is another schematic planar structural diagram of a display substrate provided by an embodiment of the present disclosure.
Figure 9:
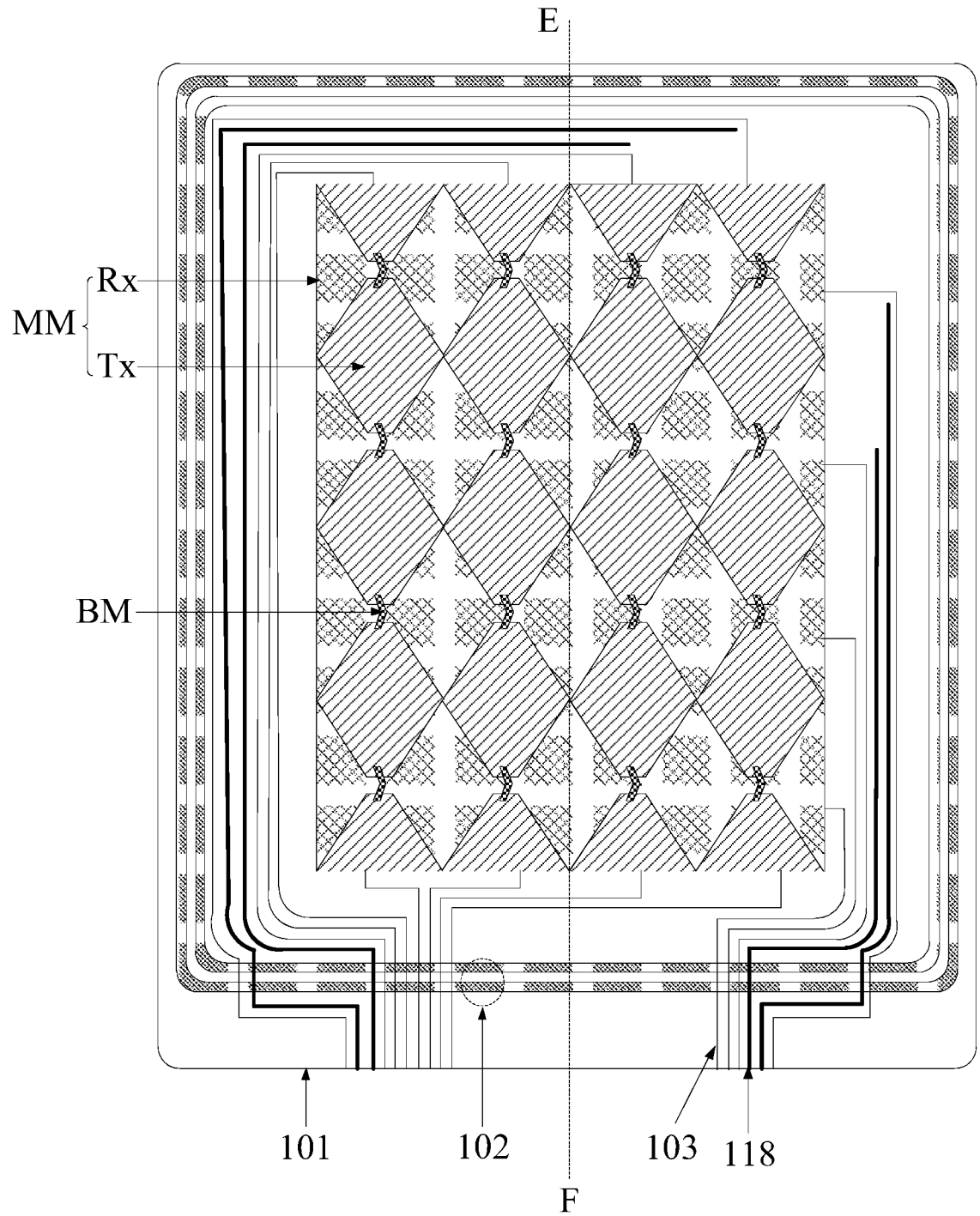
FIG. 9 is another schematic planar structural diagram of a display substrate provided by an embodiment of the present disclosure.
Figure 10:
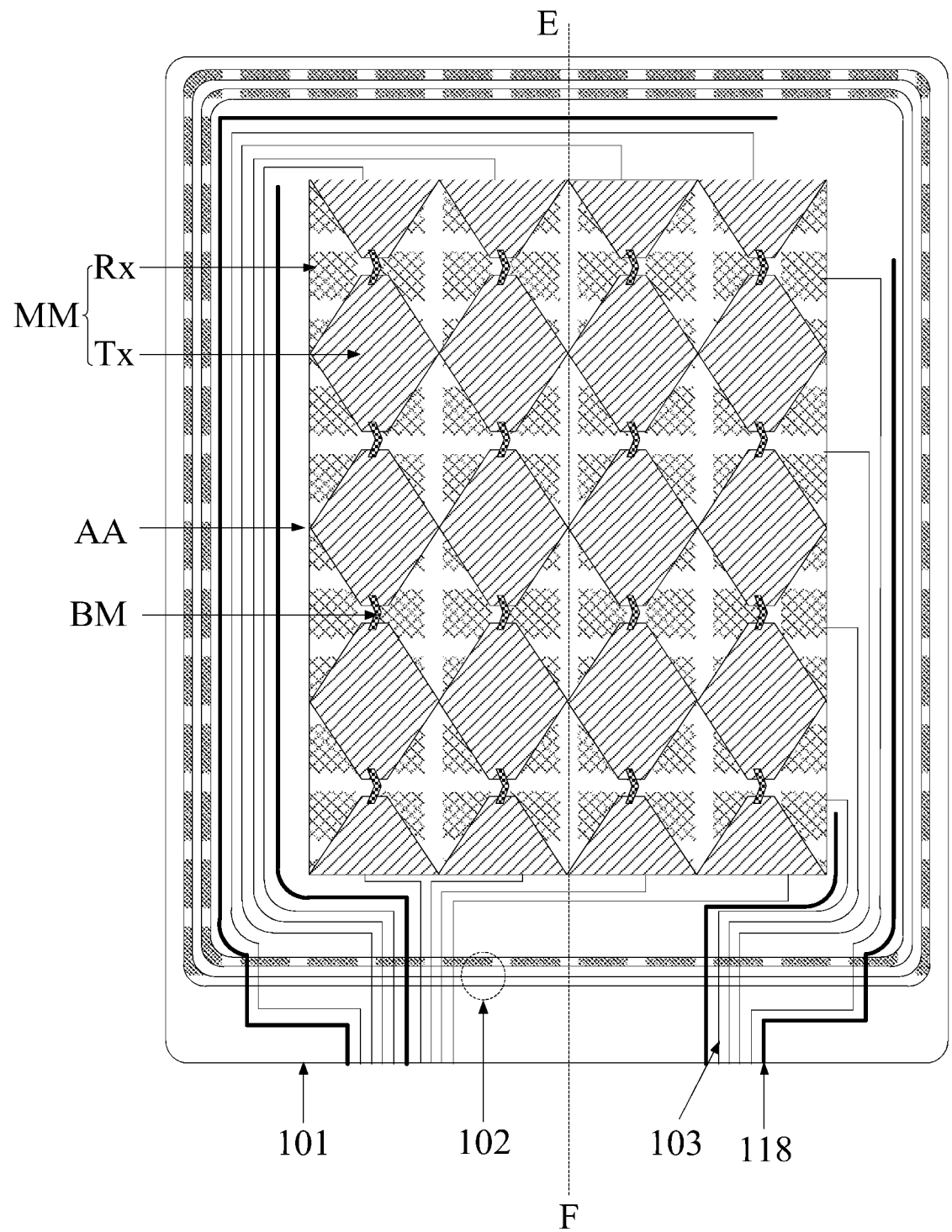
FIG. 10 is another schematic planar structural diagram of a display substrate provided by an embodiment of the present disclosure.
Figure 11:
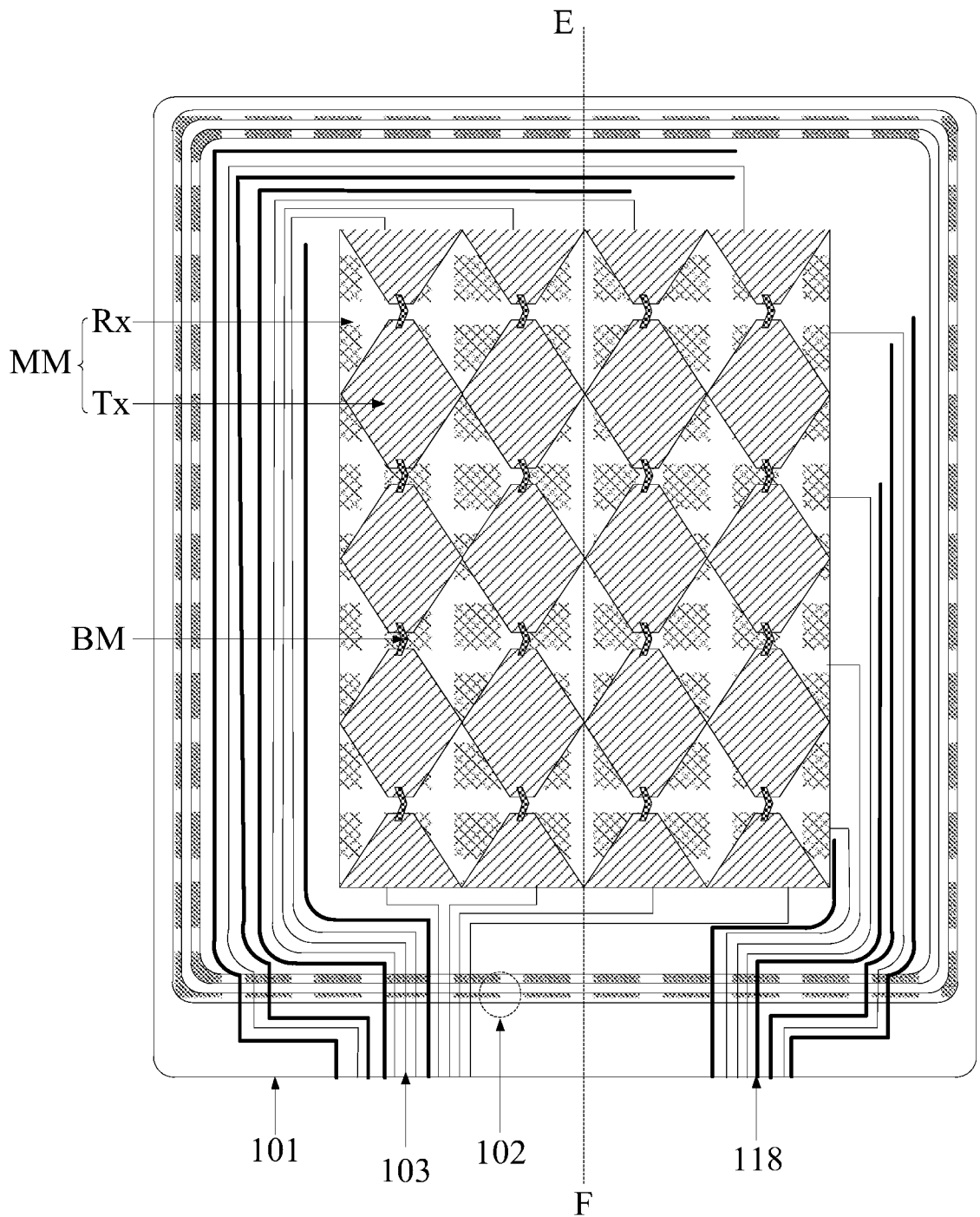
FIG. 11 is another schematic planar structural diagram of a display substrate provided by an embodiment of the present disclosure.

In some embodiments, as shown in FIG. 7, the at least one shielded wire 118 may be arranged around the touch signal lines 103 containing the first routing wires $L_1$. In some embodiments, as shown in FIG. 8, the at least one shielded wire 118 may be arranged around the touch signal lines 103 containing the second routing wires $L_2$. In some embodiments, there are a plurality of the at least one shielded wire 118, as shown in FIG. 9, the plurality of shielded wires 118 may be arranged around the touch signal lines 103 containing the first routing wires $L_1$ and the touch signal lines 103 containing the second routing wires $L_2$. In some other embodiments, as shown in FIG. 10, in at least one group of touch signal lines, the quantity of the at least one shielded wire 118 is two, one of the shielded wires 118 is arranged on a side of the first routing wires $L_1$ adjacent to the display region AA in the second direction Y, and the other shielded wire 118 is arranged on a side of the second routing wires $L_2$ away from the display region AA in the second direction Y. In some other embodiments, as shown in FIG. 11, the shielded wires 118 may be also arranged on two sides of the plurality of first routing wires $L_1$ in the second direction Y and on two sides of the plurality of second routing wires $L_2$ in the second direction Y respectively.

During specific implementation, in order to realize a better shielding effect, direct current signals such as a first power signal Vdd, a second power signal Vss and an initialization signal Vinit may be loaded on the shielded wire 118. Besides, in order to reduce the quantity of film layers, the shielded wire 118 and the touch signal lines 103 may be arranged on the same layer.

Optionally, in the above display substrate provided by the embodiment of the present disclosure, a sum of a shortest distance between each shielded wire 118 and each touch signal line 103 and a wire width of a single shielded wire 118 may be greater than 30 so as to better isolate mutual interference of different signals (for example, a signal Tx and a signal Rx) on the touch signal lines 103 on two sides of the shielded wire 118. In some embodiments, under the condition that the signals on the touch signal lines 103 on the two sides of the shielded wires 118 are the same, the sum of the shortest distance between each shielded wire 118 and each touch signal line 103 and a wire width of a single shielded wire 118 may be not specially limited. In some embodiments, the wire width of the single shielded wire 118 may be about 9.2 μm.

Figure 12:
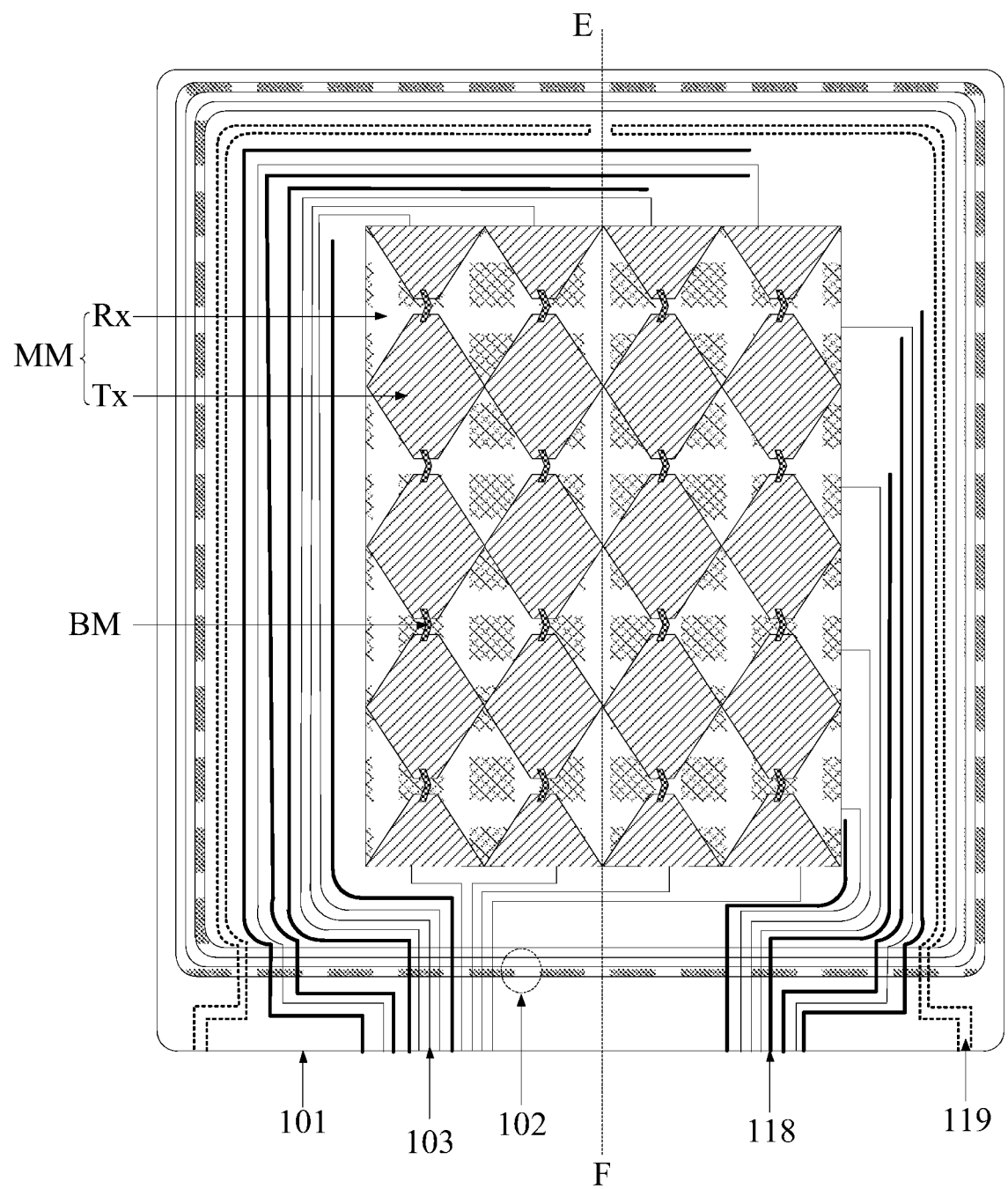
FIG. 12 is another schematic planar structural diagram of a display substrate provided by an embodiment of the present disclosure.

Optionally, the above display substrate provided by the embodiment of the present disclosure, as shown in FIG. 12, may further include: a crack detection line 119 (PCD) located on a side of the shielded wire 118 away from the display region AA. The crack detection line 119 strides over the blocking dam 102 in the frame region BB where the first routing wires L₁ are located, and is located between the blocking dam 102 and the display region AA in the other frame regions BB.

Winding of the whole PCD is arranged on a backplane end and a touch panel end. In some embodiments, there are two loops of the crack detection line 119, namely, a left one and a right one. One end of the crack detection line 119 is connected to a data line corresponding to a green sub-pixel in a cell text unit, the other end is connected into a high-level (VGH) signal, and the VGH signal is provided by the flexible print circuit board. In a case of no crack, a high voltage is given by the data line and input into green sub-pixels in a corresponding column, so that an electric current flowing through a light-emitting device (for example, an OLED) of the green sub-pixels is small, and the light-emitting device hardly emits light and is in a black state. In a case of having a crack, it can be believed that a detection voltage signal at the moment is 0 V approximately, the 0 v voltage is input into the green sub-pixels in the corresponding column, so that an electric current flowing the light-emitting device of the green sub-pixels in the corresponding column is large, so the light-emitting device emits light, and a green bright line occurs under a black picture. Besides, in order to reduce the quantity of film layers, the crack detection line 119 and the touch signal lines 103 may be arranged on the same layer.

Figure 13:
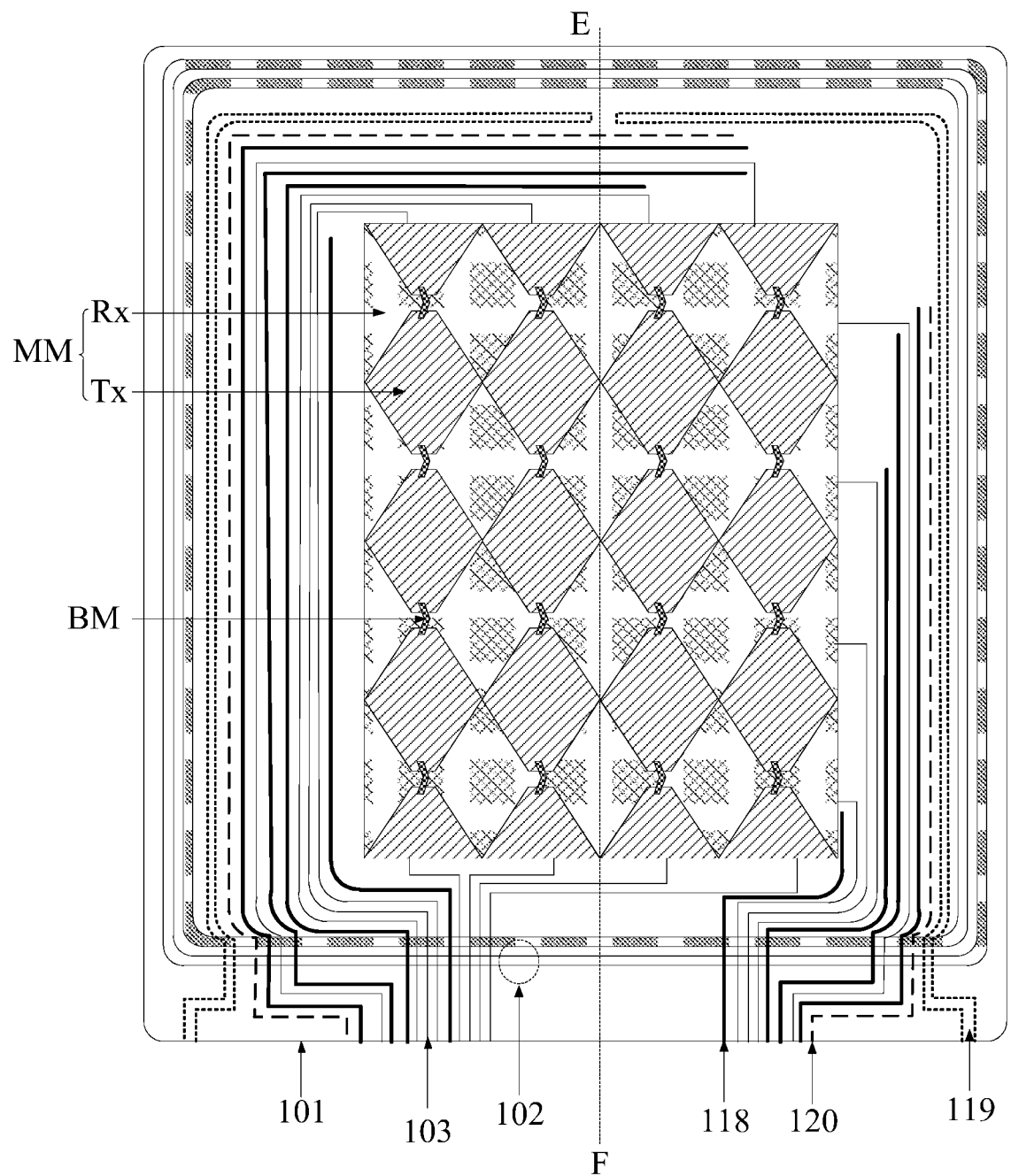
FIG. 13 is another schematic planar structural diagram of a display substrate provided by an embodiment of the present disclosure.

Optionally, the above display substrate provided by the embodiment of the present disclosure, as shown in FIG. 13, may further include: a ground line 120 (GND) located between the shielded wire 118 and the crack detection line 119, and a routing direction of the ground line 120 is the same as a routing direction of the shielded wire 118 approximately. During specific implementation, the ground line 120 is grounded and is not loaded with any signal. Besides, in order to reduce the quantity of the film layers, the ground line 120 and the touch signal lines 103 may be arranged on the same layer.

In some embodiments, the above display substrate provided by the present disclosure may be an organic light emitting diode (OLED) display substrate, a quantum light emitting diode (QLED) display substrate, or a micro LED display substrate, and the like.

Based on the same inventive concept, an embodiment of the present disclosure further provides a display device, including the above display substrate provided by the embodiment of the present disclosure.

In some embodiments, the display device may be: a mobile phone, a tablet computer, a television, a display, a notebook computer, a digital phone frame, a navigator, a smart watch, a fitness wristband, a personal digital assistant and any other product or component with a display function. Other necessary components (for example, a driving chip) of the display device should be understood by those ordinarily skilled in the art, which is neither repeated here nor serves as limit on the present disclosure. Besides, a principle of solving problems of the display device is similar to a principle of solving problem of the above display substrate, so implementation of the display device may refer to the embodiment of the above display substrate, and repetitions are omitted.

Apparently, those skilled in the art can make various modifications and transformations to the embodiments of the present disclosure without departing from the spirit and scope of the embodiments of the present disclosure. In this case, if these modifications and transformations of the embodiments of the present disclosure fall within the scope of claims of the present disclosure and their equivalents, the present disclosure also intends to contain these modifications and the transformations.

What is claimed is:

1. A display substrate, comprising:
    a base substrate, comprising: a display region, and a frame region surrounding the display region;
    at least one circle of blocking dam, arranged around the display region in the frame region; and
    a touch metal layer, located on a side, facing away from the base substrate, of a layer where the blocking dam is located, and comprising a plurality of touch electrodes, and a plurality of touch signal lines electrically connected to the plurality of touch electrodes, wherein
    the plurality of touch electrodes are at least partially located in the display region, and the plurality of touch signal lines are located in the frame region;
    the plurality of touch signal lines comprise:
    a plurality of first routing wires and a plurality of second routing wires arranged in parallel in a first direction, wherein
    orthographic projections of the plurality of first routing wires on the base substrate are located between an orthographic projection of the blocking dam on the base substrate and the display region, and
    orthographic projections of the plurality of second routing wires on the base substrate are located on a side, away from the display region, of the orthographic projection of the blocking dam on the base substrate;
    wherein the plurality of touch signal lines further comprise:
    a plurality of third routing wires and a plurality of fourth routing wires arranged in parallel in a second direction, wherein the second direction intersects with the first direction;
    the third routing wires and the first routing wires are of an integrated structure in a one-to-one correspondence mode, and the fourth routing wires and the second routing wires are of an integrated structure in a one-to-one correspondence mode; and
    orthographic projections of the plurality of third routing wires and orthographic projections of the plurality of fourth routing wires on the base substrate stride over the orthographic projection of the blocking dam on the base substrate;
    wherein the frame region comprises a bending region located on a side of the blocking dam away from the display region;
    the orthographic projections of the second routing wires on the base substrate are located between the orthographic projection of the blocking dam on the base substrate and the bending region;
    the orthographic projections of the third routing wires on the base substrate are located between the orthographic projections of the corresponding first routing wires on the base substrate and the bending region; and
    the orthographic projections of the fourth routing wires on the base substrate are located between the orthographic projections of the corresponding second routing wires on the base substrate and the orthographic projections of the first routing wires on the base substrate;
    wherein the frame region further comprises a pad region located on a side of the bending region away from the blocking dam;
    the plurality of touch signal lines further comprise:
    a plurality of fifth routing wires and a plurality of sixth routing wires arranged in parallel in the second direction, wherein the plurality of fifth routing wires and the plurality of sixth routing wires are arranged side by side on a side of the second routing wires adjacent to a central axis of the base substrate in the second direction;

the fifth routing wires, the third routing wires and the first routing wires are of an integrated structure in a one-to-one correspondence mode, the fifth routing wires are connected to one ends of the first routing wires adjacent to the central axis of the base substrate in the second direction through the third routing wires, and the fifth routing wires extend to the pad region via the bending region; and the sixth routing wires, the fourth routing wires and the second routing wires are of an integrated structure in a one-to-one correspondence mode, the fourth routing wires are connected to the other ends of the second routing wires away from the central axis of the base substrate in the second direction, the sixth routing wires are connected to one ends of the second routing wires adjacent to the central axis of the base substrate in the second direction, and the sixth routing wires extend to the pad region via the bending region;

wherein one ends of the first routing wires away from the central axis of the base substrate in the second direction and one ends of the fourth routing wires away from the second routing wires are located in a frame region adjacent to a frame region where the plurality of third routing wires are located; and orthographic projections, on the base substrate, of the ends of the first routing wires away from the central axis of the base substrate in the second direction and orthographic projections of the ends of the fourth routing wires away from the second routing wires on the base substrate are located between the orthographic projection of the blocking dam on the base substrate and the display region.

2. The display substrate according to claim 1, further comprising:

an organic insulation layer having a first groove, wherein the first groove is located between the orthographic projection of the blocking dam on the base substrate and the orthographic projections of the plurality of first routing wires on the base substrate; and a quantity $N_1$ of the plurality of first routing wires meets a formula: $N_1 \leq (D-d_1-d_2)/(d_3+d_4)$, and a quantity $N_2$ of the plurality of second routing wires meets a formula: $N_2 \geq N-N_1$, wherein D is a shortest distance between a boundary of the display region and the blocking dam, $d_1$ is a shortest distance between the first groove and the first routing wires, $d_2$ is a width of the first groove in a second direction, $d_3$ is a wire width of the first routing wires, $d_4$ is a spacing between adjacent first routing wires, and N is a total quantity of the plurality of touch signal lines.

3. The display substrate according to claim 2, wherein the quantity $N_1$ of the plurality of first routing wires is smaller than or equal to 27, and the quantity $N_2$ of the plurality of second routing wires is smaller than or equal to 23.

4. The display substrate according to claim 1, wherein the plurality of touch signal lines further comprise: a plurality of seventh routing wires and a plurality of eighth routing wires arranged in parallel in the second direction, wherein the seventh routing wires and the first routing wires are of an integrated structure in a one-to-one correspondence mode, and the seventh routing wires are connected to the ends of the first routing wires away from the central axis of the base substrate in the second direction; and the eighth routing wires and the fourth routing wires are of an integrated structure in a one-to-one correspondence mode, and the eighth routing wires are connected to the ends of the fourth routing wires away from the second routing wires.

5. The display substrate according to claim 1, wherein the plurality of touch signal lines are divided into two groups, and the two groups of touch signal lines are arranged symmetrically about a central axis of the base substrate in a second direction.

6. The display substrate according to claim 4, wherein a wire width of the first routing wires and a wire width of the second routing wires are smaller than a wire width of the third routing wires, a wire width of the fourth routing wires, a wire width of the fifth routing wires and a wire width of the sixth routing wires, and the wire width of the first routing wires and the wire width of the second routing wires are approximately equal to a wire width of the seventh routing wires and a wire width of the eighth routing wires.

7. The display substrate according to claim 6, wherein the wire width of the first routing wires and the wire width of the second routing wires range from 3 μm to 20 μm, the wire width of the third routing wires, the wire width of the fourth routing wires, the wire width of the fifth routing wires and the wire width of the sixth routing wires range from 5 μm to 20 μm, and the wire width of the seventh routing wires and the wire width of the eighth routing wires range from 3 μm to 20 μm.

8. The display substrate according to claim 1, wherein resistance values of the touch signal lines are the same approximately.

9. The display substrate according to claim 2, wherein the organic insulation layer further comprises a second groove, and the second groove is located on a side of the blocking dam away from the display region; and the orthographic projections of the second routing wires on the base substrate are located in the second groove;

wherein in the second direction, the width of the first groove is smaller than a width of the second groove.

10. The display substrate according to claim 1, wherein a shortest distance between the orthographic projections of the first routing wires on the base substrate and the orthographic projection of the blocking dam on the base substrate is greater than a shortest distance between the orthographic projections of the second routing wires on the base substrate and the orthographic projection of the blocking dam on the base substrate.

11. The display substrate according to claim 10, wherein the shortest distance between the orthographic projections of the first routing wires on the base substrate and the orthographic projection of the blocking dam on the base substrate ranges from 30 μm to 200 μm, and the shortest distance between the orthographic projections of the second routing wires on the base substrate and the orthographic projection of the blocking dam on the base substrate ranges from 10 μm to 100 μm.

12. The display substrate according to claim 1, further comprising: at least one shielded wire, wherein the at least one shielded wire is located on at least one side of the plurality of first routing wires in a second direction, and/or located on at least one side of the plurality of second routing wires in a second direction;

wherein the at least one shielded wire is arranged surrounding the touch signal lines containing the first routing wires, and/or the at least one shielded wire is arranged surrounding the touch signal lines containing the second routing wires.

13. The display substrate according to claim 12, wherein a quantity of the at least one shielded wire is two, one of the shielded wires is arranged on a side of the first routing wires adjacent to the display region in the second direction, and an other shielded wire is arranged on a side of the second routing wires away from the display region in the second direction.

14. The display substrate according to claim 13, further comprising: a crack detection line located on a side of the shielded wire away from the display region; and
the crack detection line strides over the blocking dam in a frame region where the first routing wires are located, and is located between the blocking dam and the display region in the other frame regions.

15. The display substrate according to claim 14, further comprising: a ground wire located between the shielded wire and the crack detection line, wherein a routing direction of the ground wire is the same as a routing direction of the shielded wire approximately;
wherein in a direction away from one side of the base substrate, a distance between the first routing wires and the base substrate is greater than a distance between the second routing wires and the base substrate.

16. A display device, comprising a display substrate, wherein the display substrate comprises:
a base substrate, comprising:
a display region, and a frame region surrounding the display region;
at least one circle of blocking dam, arranged around the display region in the frame region; and
a touch metal layer, located on a side, facing away from the base substrate, of a layer where the blocking dam is located, and comprising a plurality of touch electrodes, and a plurality of touch signal lines electrically connected to the plurality of touch electrodes, wherein the plurality of touch electrodes are at least partially located in the display region, and the plurality of touch signal lines are located in the frame region;
the plurality of touch signal lines comprise:
a plurality of first routing wires and a plurality of second routing wires arranged in parallel in a first direction, wherein orthographic projections of the plurality of first routing wires on the base substrate are located between an orthographic projection of the blocking dam on the base substrate and the display region, and
orthographic projections of the plurality of second routing wires on the base substrate are located on a side, away from the display region, of the orthographic projection of the blocking dam on the base substrate;
wherein the plurality of touch signal lines further comprise:
a plurality of third routing wires and a plurality of fourth routing wires arranged in parallel in a second direction, wherein the second direction intersects with the first direction;
the third routing wires and the first routing wires are of an integrated structure in a one-to-one correspondence mode, and the fourth routing wires and the second routing wires are of an integrated structure in a one-to-one correspondence mode; and
orthographic projections of the plurality of third routing wires and orthographic projections of the plurality of fourth routing wires on the base substrate stride over the orthographic projection of the blocking dam on the base substrate;
wherein the frame region comprises a bending region located on a side of the blocking dam away from the display region;
the orthographic projections of the second routing wires on the base substrate are located between the orthographic projection of the blocking dam on the base substrate and the bending region;
the orthographic projections of the third routing wires on the base substrate are located between the orthographic projections of the corresponding first routing wires on the base substrate and the bending region; and
the orthographic projections of the fourth routing wires on the base substrate are located between the orthographic projections of the corresponding second routing wires on the base substrate and the orthographic projections of the first routing wires on the base substrate;
wherein the frame region further comprises a pad region located on a side of the bending region away from the blocking dam;
the plurality of touch signal lines further comprise:
a plurality of fifth routing wires and a plurality of sixth routing wires arranged in parallel in the second direction, wherein the plurality of fifth routing wires and the plurality of sixth routing wires are arranged side by side on a side of the second routing wires adjacent to a central axis of the base substrate in the second direction;
the fifth routing wires, the third routing wires and the first routing wires are of an integrated structure in a one-to-one correspondence mode,
the fifth routing wires are connected to one ends of the first routing wires adjacent to the central axis of the base substrate in the second direction through the third routing wires, and
the fifth routing wires extend to the pad region via the bending region; and
the sixth routing wires, the fourth routing wires and the second routing wires are of an integrated structure in a one-to-one correspondence mode,
the fourth routing wires are connected to the other ends of the second routing wires away from the central axis of the base substrate in the second direction,
the sixth routing wires are connected to one ends of the second routing wires adjacent to the central axis of the base substrate in the second direction, and
the sixth routing wires extend to the pad region via the bending region;
wherein one ends of the first routing wires away from the central axis of the base substrate in the second direction and one ends of the fourth routing wires away from the second routing wires are located in a frame region adjacent to a frame region where the plurality of third routing wires are located; and
orthographic projections, on the base substrate, of the ends of the first routing wires away from the central axis of the base substrate in the second direction and orthographic projections of the ends of the fourth routing wires away from the second routing wires on the base substrate are located between the orthographic projection of the blocking dam on the base substrate and the display region.

* * * * *